US011222589B2

(12) United States Patent
Kimura

(10) Patent No.: US 11,222,589 B2
(45) Date of Patent: Jan. 11, 2022

(54) DISPLAY APPARATUS, METHOD OF DRIVING DISPLAY APPARATUS, AND ELECTRONIC EQUIPMENT

(71) Applicant: Sony Group Corporation, Tokyo (JP)

(72) Inventor: Kei Kimura, Kanagawa (JP)

(73) Assignee: Sony Group Corporation, Tokyo (JP)

(*) Notice: Subject to any disclaimer, the term of this patent is extended or adjusted under 35 U.S.C. 154(b) by 0 days.

(21) Appl. No.: 17/260,740

(22) PCT Filed: Jul. 19, 2019

(86) PCT No.: PCT/JP2019/028406
§ 371 (c)(1),
(2) Date: Jan. 15, 2021

(87) PCT Pub. No.: WO2020/031656
PCT Pub. Date: Feb. 13, 2020

(65) Prior Publication Data
US 2021/0264853 A1    Aug. 26, 2021

(30) Foreign Application Priority Data

Aug. 10, 2018  (JP) .............................. JP2018-151772

(51) Int. Cl.
*G09G 3/3233*      (2016.01)
*G09G 3/3291*      (2016.01)

(52) U.S. Cl.
CPC ......... *G09G 3/3233* (2013.01); *G09G 3/3291* (2013.01); *G09G 2300/0426* (2013.01); *G09G 2310/0202* (2013.01)

(58) Field of Classification Search
None
See application file for complete search history.

(56) References Cited

U.S. PATENT DOCUMENTS

2011/0210958 A1* 9/2011 Yoo .................. G09G 3/325
345/214
2014/0264305 A1* 9/2014 Takahara ............ H01L 27/3279
257/40

(Continued)

FOREIGN PATENT DOCUMENTS

JP    2015-96906 A    5/2015
JP    2015-187672 A   10/2015
WO   2013/114495 A1   8/2013

OTHER PUBLICATIONS

International Search Report (PCT/ISA/210), International Application No. PCT/JP2019/028406, dated Oct. 30, 2019.

(Continued)

*Primary Examiner* — Dorothy Harris
(74) *Attorney, Agent, or Firm* — Michael Best & Friedrich LLP

(57) ABSTRACT

A display apparatus includes a pixel array section that has pixels arranged in a row direction and a column direction in a two-dimensional matrix pattern, each of the pixels including a display element; a scanning line provided for each of the pixel rows arranged in the row direction; and a data line provided for each of the pixel columns arranged in the column direction. With the data line in a state of holding a video signal voltage, the voltage of a scanning line different from the scanning line of the pixel targeted for writing is changed so as to vary the voltage of the data line via a capacity between the data line and the scanning line. The scanning line of the pixel targeted for writing is thereafter driven to write the voltage of the data line to the pixel.

16 Claims, 23 Drawing Sheets

(56) References Cited

U.S. PATENT DOCUMENTS

2015/0138253 A1* 5/2015 Kimura ............... H01L 27/3248
                                                    345/690
2018/0190197 A1* 7/2018 Chang .................. G09G 3/3233

OTHER PUBLICATIONS

Notification of Transmittal of the International Search Report and the Written Opinion of the International Searching Authority, or the Declaration (PCT/ISA/220), International Application No. PCT/JP2019/028406, dated Oct. 15, 2019.

* cited by examiner

[TP0]

[TP0 (CONTINUED) TO TP1]

[TP2]

[TP3]

[TP4]

[TP4 (CONTINUED)]

[FROM TP5 ON]

[TP1]

[TP2]

[TP3]

[TP4]

[TP5]

[TP6]

[TP6 (CONTINUED)]

[FROM TP7 ON]

DISPLAY APPARATUS, METHOD OF DRIVING DISPLAY APPARATUS, AND ELECTRONIC EQUIPMENT

TECHNICAL FIELD

The present disclosure relates to a display apparatus, a method of driving a display apparatus, and electronic equipment.

BACKGROUND ART

There are known display elements each having a current-driven light-emitting section and display apparatuses equipped with such light-emitting elements. For example, attention is drawn to a display element that has a light-emitting section including an organic electroluminescence element, the display element being capable of high-luminance light emission driven by a low voltage direct current. A display element driven by an active matrix system includes, in addition to a light-emitting section including organic layers that includes a light-emitting layer and the like, a drive circuit for driving the light-emitting section.

There is known a drive circuit including transistors and a capacity section, the drive circuit driving the current-driven light-emitting section (for example, see PTL 1). FIG. 23 depicts a typical circuit configuration of a pixel positioned in an m-th row and an n-th column of a display apparatus that uses, as its pixels, display elements each constituting a drive circuit with use of p-channel type transistors.

A drive circuit 971 in a pixel 970 of a display apparatus 9 includes a drive transistor $TR_D$, a write transistor $TR_W$, and a capacity section $C_S$. A light-emitting section ELP emits light with a luminance level corresponding to the value of a flowing current. The current flowing through the light-emitting section ELP is controlled by a gate-to-source voltage of the drive transistor $TR_D$.

The write transistor $TR_W$ enters a conductive state in response to a scan pulse in an active state at a low voltage) supplied via a scanning line WS from a vertical scanner 920. With the write transistor $TR_W$ in the conductive state, a video signal voltage $V_{Sig}$ supplied from a source driver 910 to a signal line DTL is written to the pixel 970.

The capacity section $C_S$ is connected interposingly between the gate electrode and source electrode of the drive transistor $TR_D$. The source electrode of the drive transistor $TR_D$ is supplied with a power supply voltage $V_{CC}$ from a power supply section 930, and the gate electrode of the drive transistor $TR_D$ is supplied with the video signal voltage $V_{Sig}$. As a result, the capacity section $C_S$ retains a voltage of $(V_{CC}-V_{Sig})$ as a gate-to-source voltage of the drive transistor $TR_D$. A drain current $I_{ds}$ defined by the expression (1) below flows through the drive transistor $TR_D$, and the light emitting section ELP emits light with a luminance level corresponding to the current value.

$$I_{ds}=k\mu \cdot ((V_{CC}-V_{Sig})-|V_{th}|)^2 \qquad (1)$$

where,
μ: effective mobility
L: channel length
W: channel width
$V_{th}$: threshold voltage
$C_{ox}$: (specific inductive capacity of gate insulating layer)× (dielectric constant of vacuum)/(thickness of gate insulating layer)
k≡(½)·(W/L)·$C_{ox}$

CITATION LIST

Patent Literature

[PTL 1]
Japanese Patent Laid-open No. 2015-187672

SUMMARY

Technical Problems

For example, in a case where the drive transistor $TR_D$ is a p-channel type transistor as depicted in FIG. 23, implementing high-contrast black gradation requires supplying the gate electrode of the drive transistor $TR_D$ with a voltage equivalent to or higher than the voltage on the source electrode side (power supply voltage $V_{CC}$ in the example of FIG. 23) in order to sufficiently reduce a leak current of the drive transistor $TR_D$.

However, in the case of a configuration in which the pixel and the source driver drive by being supplied with a common power supply voltage $V_{CC}$, it is difficult for the source driver to output a video signal voltage $V_{Sig}$ exceeding the power supply voltage $V_{CC}$. Thus, implementing high-contrast display has conventionally required that the power supply voltage supplied to the pixel be made lower than the power supply voltage fed to the source driver.

However, in a case where the power supply voltage supplied to the pixel is different from the power supply voltage fed to the source driver, it is necessary to add a voltage generation block and increase a voltage application terminal. This can lead to an enlarged size of the display apparatus and increased power consumption. Also, causing the power supply voltage fed to the pixel to be relatively low impedes efforts to improve the luminance of the display apparatus.

It is therefore an object of the present disclosure to provide a display apparatus that writes to pixels a voltage exceeding the video signal voltage output from the source driver, a method of driving such a display apparatus, and electronic equipment having such a display apparatus.

Solution to Problems

In achieving the above object and according to the present disclosure, there is provided a display apparatus including
a pixel array section that has pixels arranged in a row direction and a column direction in a two-dimensional matrix pattern, each of the pixels including a display element,
a scanning line provided for each of the pixel rows arranged in the row direction, and
a data line provided for each of the pixel columns arranged in the column direction,
in which, with the data line in a state of holding a video signal voltage, a voltage of a scanning line different from the scanning line of the pixel targeted for writing is changed so as to vary a voltage of the data line via a capacity between the data line and the scanning line, the scanning line of the pixel targeted for writing being driven thereafter to write the voltage of the data line to the pixel.

In achieving the above object and also according to the present disclosure, there is provided a method of using and driving a display apparatus that includes a pixel array section that has pixels arranged in a row direction and a column direction in a two-dimensional matrix pattern, each of the pixels including a display element, a scanning dine provided for each of the pixel rows arranged in the row direction, and a data line provided for each of the pixel columns arranged in the column direction, the method including the steps of causing the data line to hold a video signal voltage, then changing a voltage of a scanning line different from the scanning line of the pixel targeted for writing so as to vary a voltage of the data line via a capacity between the data line and the scanning line, and thereafter driving the scanning line of the pixel targeted for writing, to write the voltage of the data line to the pixel.

In achieving the above object and also according to the present disclosure, there is provided electronic equipment having a display apparatus that includes a pixel array section that has pixels arranged in a row direction and a column direction in a two-dimensional matrix pattern, each of the pixels including a display element, a scanning line provided for each of the pixel rows arranged is the row direction, and a data line provided for each of the pixel columns arranged in the column direction, in which, with the data line in a state of holding a video signal voltage, a voltage of a scanning line different from the scanning line of the pixel targeted for writing is changed so as to vary a voltage of the data line via a capacity between the data line and the scanning line, the scanning line of the pixel targeted for writing being driven thereafter to write the voltage of the data line to the pixel.

DESCRIPTION OF EMBODIMENT

Figure 1:
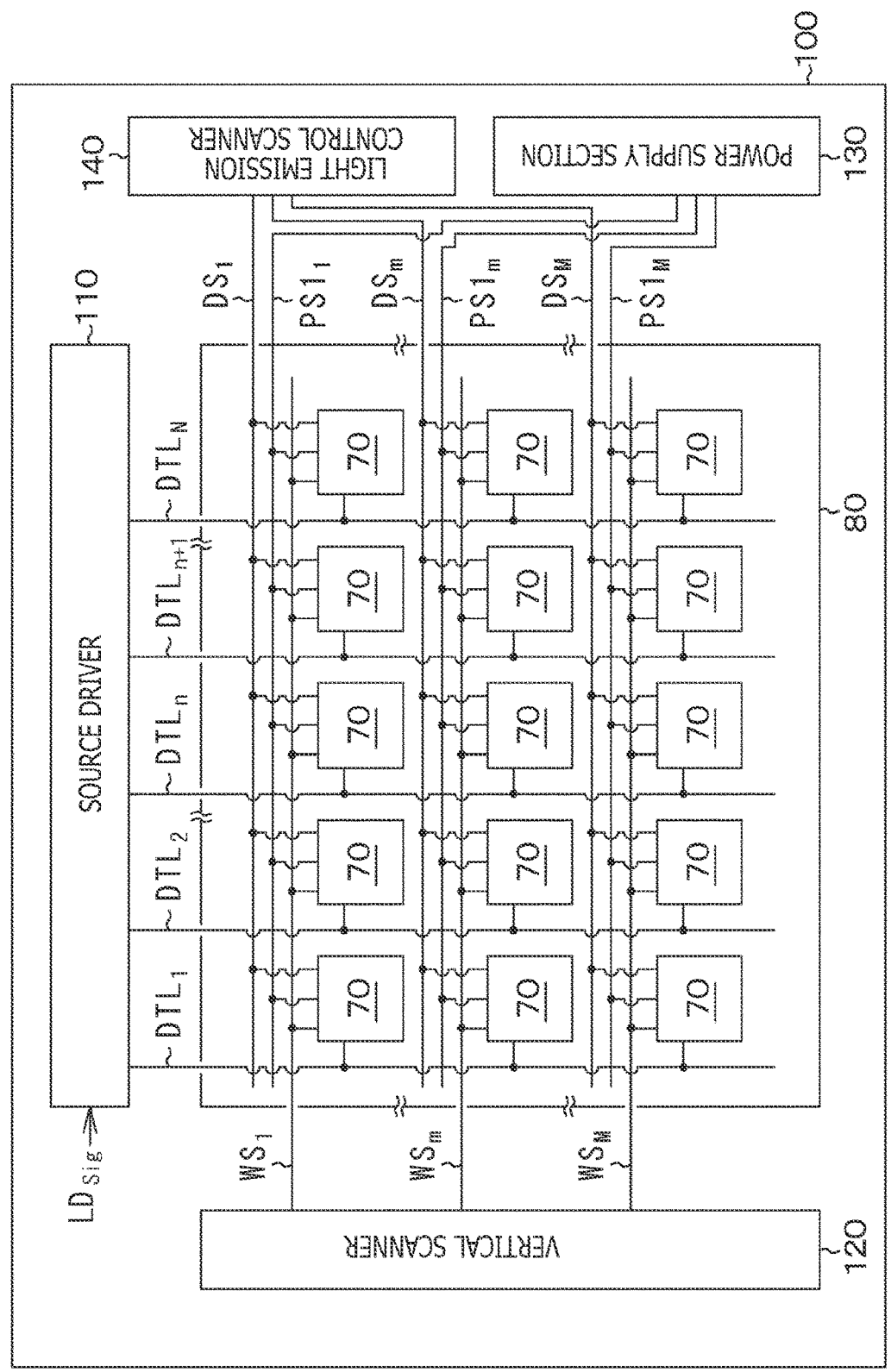
FIG. 1 is a conceptual view of a display apparatus as a first embodiment of the present disclosure.

The present disclosure will be described below on the basis of an embodiment with reference to the accompanying drawings. The present disclosure is not limited to the embodiment, and various numerical values and materials cited in connection with the embodiment are merely examples. Throughout the ensuing description, identical reference signs designate identical or corresponding elements having identical functions, and the explanations of such elements will be omitted where redundant. Note that the description is made in the following order:

1. Overall description of the display apparatus, the method of driving the display apparatus, and the electronic equipment according to the present disclosure 2. First embodiment 3. Description of the electronic equipment and others Overall Description of the Display Apparatus, the Method of Driving the Display Apparatus, and the Electronic Equipment According to the Present Disclosure As outlined above, the display apparatus described in the present disclosure and the display apparatus described in the present disclosure and used by the electronic equipment according thereto (hereinafter, the apparatus may simply be referred to as the "display apparatus of the present disclosure") includes a pixel array section that has pixels arranged in a row direction and a column direction in a two-dimensional matrix pattern, each of the pixels including a display element, a scanning dine provided for each of pixel rows arranged in the row direction, and a data line provided for each of pixel columns arranged in the column direction, in which, with the data line in a state of holding a video signal voltage, a voltage of a scanning line different from the scanning line of the pixel targeted for writing is changed so as to vary a voltage of the data line via a capacity between the data line and the scanning line, the scanning line of the pixel targeted for writing being driven thereafter to write the voltage of the data line to the pixel.

In the display apparatus of the present disclosure, the voltage may be changed on at least a portion of the scanning line for a pixel row different from the pixel row including the pixel targeted for writing, the different pixel row being placed in a non-light-emitting state for a predetermined time period.

In the above-cited display apparatus as one of preferred configurations included in the present disclosure, the number of scanning lines of which the voltage is to be changed may be determined variably, the scanning lines being different from the scanning line of the pixel targeted for writing. By controlling the number of scanning lines targeted for voltage variation, this configuration controls the degree in which the voltage of the data line is to be varied. In other words, the amount of voltage offset applied to the video signal voltage is adjusted as needed.

In the above-cited display apparatus as another of the preferred configurations included in the present disclosure, the line width of the scanning line and that of the data line may be expanded in a portion where the scanning line and the data line overlap with each other. This configuration increases the capacity between the data line and the scanning line, thereby raising the degree in which the voltage of the data line is varied.

In the above-cited display apparatus as another of the preferred configurations included in the present disclosure, the pixel may include a current-driven light-emitting section and a drive circuit configured to drive the light-emitting section, and the drive circuit may at least include
a capacity section,
a drive transistor configured to cause a current corresponding to the voltage held in the capacity section to flow through the light-emitting section, and
a write transistor configured to write a signal voltage to the capacity section.

In the above case, the drive circuit may be formed on a semiconductor substrate, one source/drain region of the write transistor may be connected with the data line, and a gate electrode of the write transistor may be connected with the scanning line, and a capacity between a gate of the write transistor and the one source/drain region of the write transistor may function as the capacity between the data line and the scanning line.

Furthermore, another source/drain region of the write transistor may be connected with the gate electrode of the drive transistor.

Also in the above case, the write transistor may be configured in such a manner that the amount of overlap between the one source/drain region and the gate electrode is larger than the amount of overlap between the other source/drain region and the gate electrode. This configuration increases the capacity between the gate of the write transistor and one source/drain region thereof, the capacity functioning as the capacity between the data line and the scanning line.

In another configuration, one source/drain region of the write transistor may be connected with a branch line extending from the data line in parallel with the scanning line. This configuration has the branch line of the data line and the scanning line arranged in parallel with each other, thereby increasing the capacity developing therebetween.

In the above-cited display apparatus as another of the preferred configurations included in the present disclosure, the drive circuit may further include a light emission control transistor configured to place the light-emitting section in a non-light-emitting state, and the light emission control transistor may be controlled by a light emission control line provided for each of the pixel rows arranged in the row direction. In this case, a period in which the pixel row is placed in the non-light-emitting state by the light emission control transistor may be controlled variably. For example, the light emission control transistor may be configured to be connected serially with the drive transistor.

In the above-cited display apparatus as another of the preferred configurations included in the present disclosure, the conductivity type of the transistors included in the drive circuit is not limited to any specific type. For example, the drive transistor may include a p-channel type transistor. In this case, the gate of the drive transistor is supplied with a higher voltage, which contributes to implementing more favorable black display. Alternatively, the drive transistor may include an n-channel type transistor. In this case, the gate of the drive transistor is supplied with a higher voltage, which helps implement more favorable white display.

In the above-cited display apparatus as another of the preferred configurations included in the present disclosure, the current-driven light-emitting section may include an organic electroluminescence element, an LED element, or a semiconductor laser element. These elements may be configured using known materials and known methods. In particular, from the viewpoint of fabricating a flat-screen display apparatus, the light-emitting section may preferably be configured with an organic electroluminescence element.

In the description that follows, the display apparatus and electronic equipment according to the present disclosure may simply be referred to as the present disclosure. The source driver for driving the display apparatus and other circuits may be integrated on a semiconductor substrate where display elements are arranged. Alternatively, these circuits may be configured as independent bodies. Such elements may be configured using known circuit elements. For example, the source driver, the vertical scanner, the power supply section, and the light emission control scanner depicted in FIG. 1 may be configured using known circuit elements. For uses that require downsizing such as the display apparatus used on head-mounted displays or viewfinders, it is preferred that the display elements and the drivers be configured to be formed on the same semiconductor substrate.

The display apparatus may have what is generally called a monochromatic display configuration or a color display configuration. In the case of the color display configuration, one color pixel may include multiple pixels. Specifically, one color pixel may include a combination of a red display pixel, a green display pixel, and a blue display pixel. Furthermore, these three types of pixels may be further supplemented with one or more types of pixels in the configuration.

As typical pixel values of the display apparatus, there may be cited several image display resolutions such as U-XGA (1600, 1200), HD-TV (1920, 1080), and Q-XGA. (2048, 1536), as well as (3840, 2160) and (7680, 4320). However, these values are not limitative of the display apparatus.

Also, as the electronic equipment having the display apparatus of the present disclosure, there may be cited direct view and projection display apparatuses, as well as various types of electronic equipment equipped with an image display function.

Figure 11:
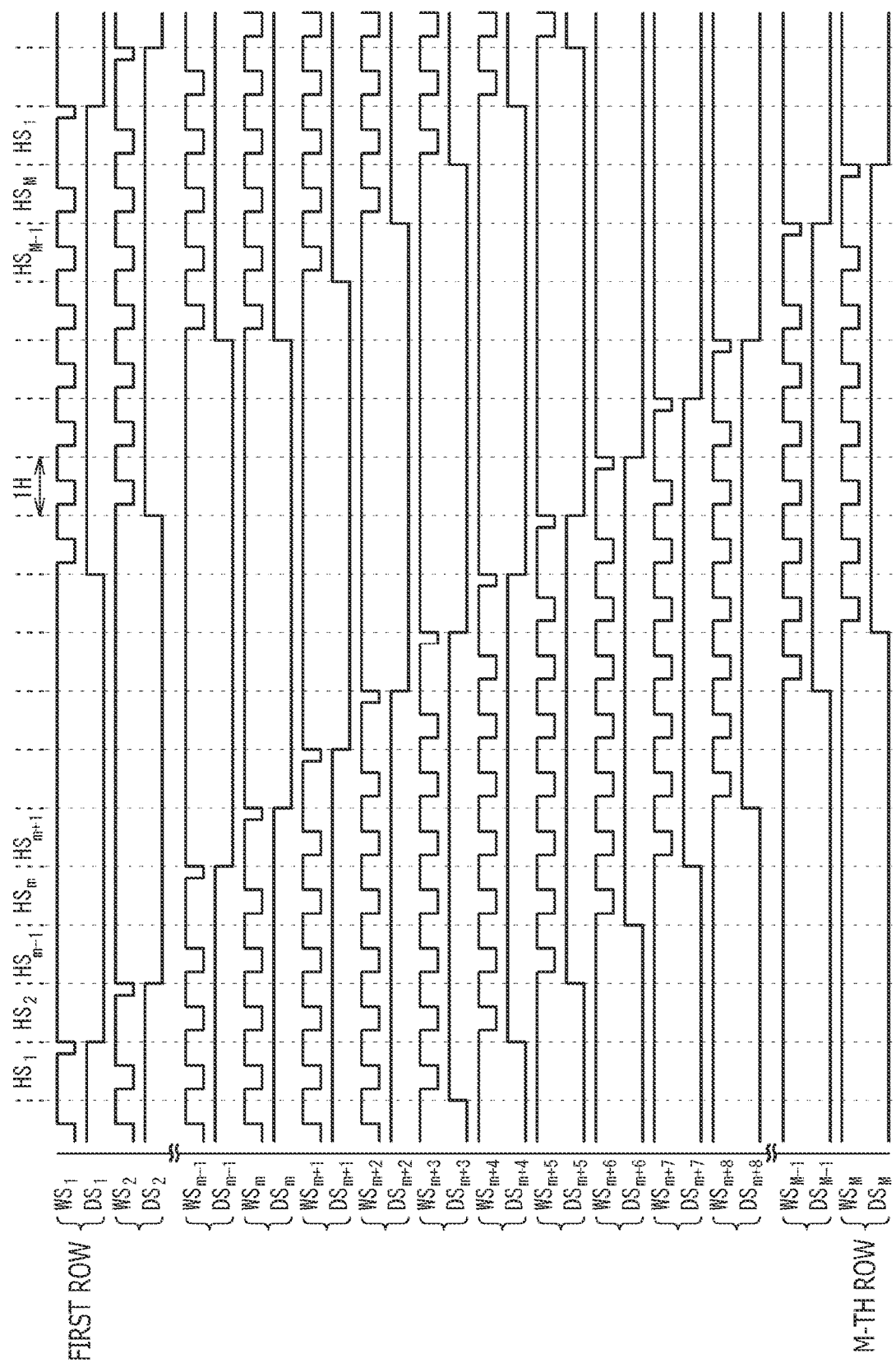
FIG. 11 is a schematic timing chart explaining the operations of the display apparatus as the first embodiment.
Figure 12:
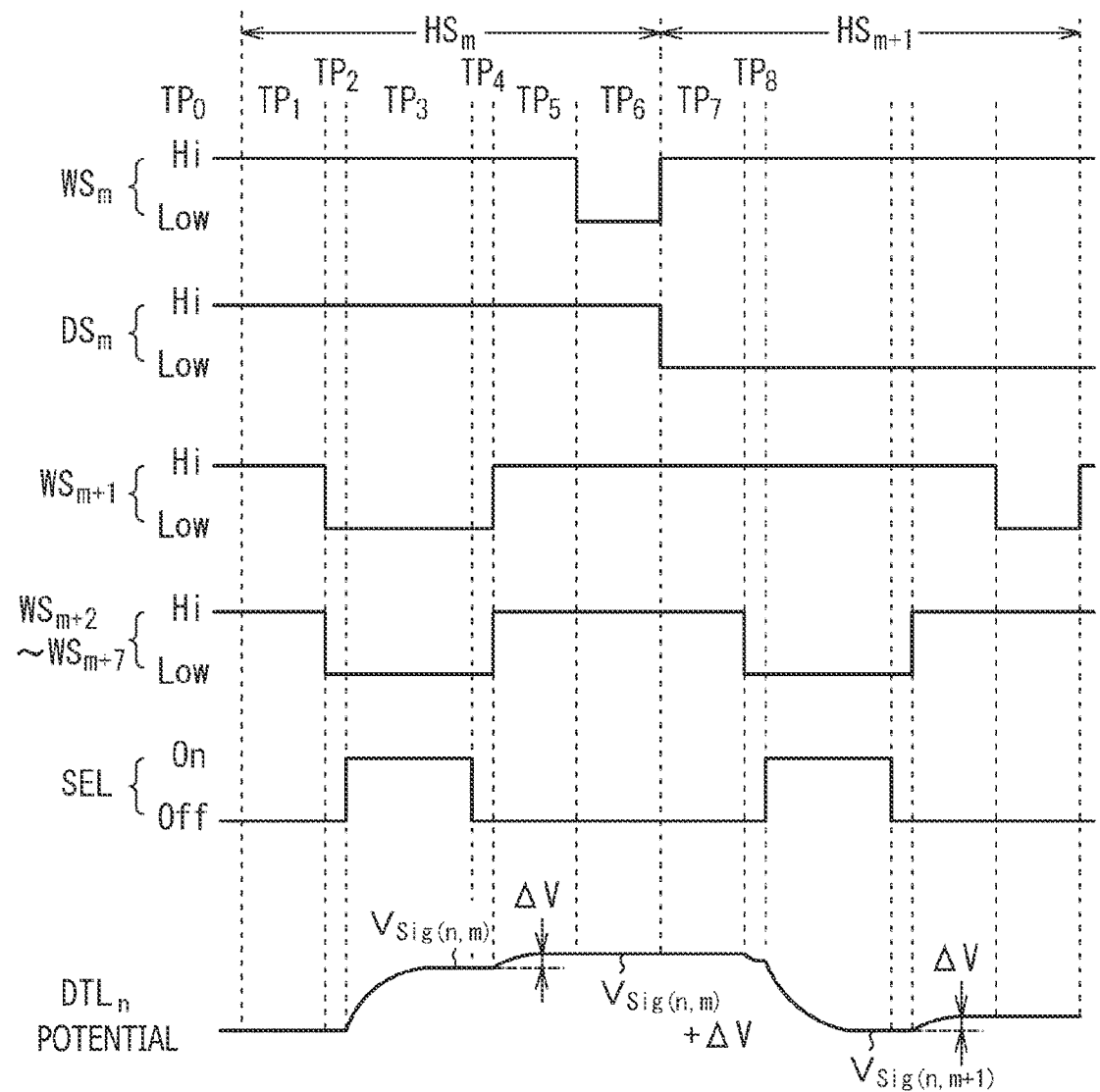
FIG. 12 is another schematic timing chart explaining the operations in an (n, m)th pixel.

It is to be noted that various conditions in the present description are considered to hold not only when exactly met is a mathematical sense but also when satisfied substantially. The conditions are allowed to have variations stemming from design or production processes. Further, the drawings used in the ensuing description are schematic and not indicative of actual sizes and their proportions. For example, FIG. 3, to be discussed later, depicts a cross-section structure of the display apparatus but does not indicate the proportions of widths, heights, or thicknesses in the structure. Also, the waveforms in the timing charts such as those in FIGS. 11 and 12 are schematic.

First Embodiment

A first embodiment of the present disclosure relates to a display apparatus, a method of driving a display apparatus, and electronic equipment according to the present disclosure.

FIG. 1 is a conceptual view of a display apparatus as the first embodiment.

First, an overview of a display apparatus is explained with reference to FIG. 1. A display apparatus 1 includes
- a pixel array section 80 that has pixels 70 including a display element each and arrayed in the directions of rows and columns constituting a two-dimensional matrix pattern,
- a scanning line WS configured to extend in the row direction and provided for each row of pixel rows, and
- a data line DTL configured to extend in the column direction and provided for each column of pixel columns.

More specifically, there are N pixels 70 arrayed in the row direction and M pixels 70 arrayed in the column direction in an N×M two-dimensional matrix pattern, each pixel 70 being connected with a scanning line WS and a feeder line (current supply line) PS1 extending in the row direction (X direction in FIG. 1) and with a data line DTL extending in the column direction (Y direction in FIG. 1).

The pixels 70 arrayed in the two-dimensional matrix pattern constitute the pixel array section 80 that displays images. The pixel array section 80 has M rows of pixels 70, each of the rows including N pixels 70.

There are M scanning lines WS and N feeder lines PS1. The pixels 70 in the m-th row (where, m=1, 2, . . . , M) are connected with the m-th scanning line $WS_m$ and m-th feeder line $PS1_m$ constituting a single pixel row. Note that, a light emission control line DS depicted in FIG. 1 is also configured to extend in the row direction and provided for each of the pixel rows. Thus, there are N light emission control lines DS. The pixels 70 in the m-th row are connected with the m-th light emission control line $DS_m$. The light emission control line DS will later be discussed in detail with reference to FIG. 2, to be explained later.

There are N data lines DTL. The pixels 70 in the n-th column (where, n=1, 2, . . . , N) are connected with the n-th data line $DTL_n$.

Note that, although not depicted in FIG. 1, the display apparatus 1 has a common feeder line PS2 connected in common with all the pixels 70. The common feeder line PS2 is supplied steadily with a common voltage such as grounding potential.

In the display apparatus 1, with a video signal voltage held on the data line DTL, the voltage is changed on a scanning line WS different from the scanning line WS of the pixel 70 targeted for writing so as to vary the voltage of the data line DTL via the capacity between the data line DTL and the scanning line WS. Thereafter, the scanning line WS of the pixel 70 targeted for writing is driven to write the voltage of the data line DTL to the pixel 70. Note that the operations involved will be discussed later in detail with reference to FIGS. 11 to 16, to be explained later.

The display apparatus 1 has a source driver 110 for driving the pixel array section. 80, a vertical scanner 120, a power supply section. 130, and a light emission control scanner 140.

The pixel array section 80 is formed on a semiconductor substrate made of silicon. Note that the source driver 110, the vertical scanner 120, the power supply section 130, and the light emission control scanner 140 are also formed on the semiconductor substrate 100. That is, the display apparatus 1 is integrated with a driver circuit. Note that, in some cases, the diverse circuits for driving the pixel array section 80 may be configured as independent bodies.

The source driver 110 receives, from an apparatus not depicted in the drawing, for example, input of a signal $LD_{Sig}$ representing the gradation corresponding to the image to be displayed. The signal $LD_{Sig}$ is a low-voltage digital signal, for example. The source driver 110 is used to generate an analog signal corresponding to the gradation value of the video signal $LD_{Sig}$ and to feed the generated analog signal as a video signal to the data line DTL. The generated analog signal has a maximum value approximately equivalent to the power supply voltage fed to the source driver 110, the signal having an amplitude of several volts.

The vertical scanner 120 supplies a scanning signal to the scanning lines WS. The scanning signal causes the pixels 70 to be scanned sequentially in units of rows. It is assumed that the power supply section 130 continuously supplies a predetermined power supply voltage to the feeder lines PS1, regardless of scanning of the scanning lines WS. Note that, in some cases, the power supply section 130 may be configured to change the voltage supplied to the feeder lines PS1, depending on the scanning of the scanning lines WS.

The light emission control scanner 140 supplies a control signal to the light emission control lines DS. This control signal causes the pixels 70 to switch between a light-emitting state and a non-light-emitting state in units of rows. When a non-light-emitting state period is inserted in a single-frame period, the effect of residual image is alleviated. This in turn reduces the blurring of contours in videos.

The period during which the pixel rows are in the non-light-emitting state may be fixed. Alternatively, the period during which the pixel rows are in the non-light-emitting state may be controlled to be variable. It is assumed here that after the voltage of the data line DTL is written to pixels 70, the pixels 70 are placed in the light-emitting state for approximately half of a single-frame period and that thereafter, the pixels 70 are placed in the non-light-emitting state for approximately another half of the single-frame period.

The display apparatus 1 is a color display apparatus, for example. A group of three pixels 70 arrayed in the row direction constitutes a single color pixel. Thus, if N'=N/3 holds, then the pixel array section 80 has N' color pixels in the row direction and N color pixels in the column direction constituting an N'×M color pixel array as a whole.

As described above, the scanning signal of the vertical scanner 120 causes the pixels 70 to be scanned sequentially in units of rows. In the description that follows, the pixel 70 positioned in the m-th row and in the n-th column will be referred to as the (n, m)th pixel 70.

In the display apparatus 1, N pixels 70 arrayed in the m-th row are driven simultaneously. In other words, the light-emitting/non-light-emitting timing of the N pixels 70 arrayed in the row direction is controlled in units of the row they belong to. If the display frame rate of the display apparatus 1 is represented by FR (times/second), then the scanning period per row when the display apparatus 1 has its pixels scanned sequentially in units of rows (i.e., in what is generally called a horizontal scanning period) is less than (1/FR)×(1/M) seconds.

The foregoing is an overall description of the display apparatus 1. That follows is a detailed description of the pixel 70.

Figure 2:
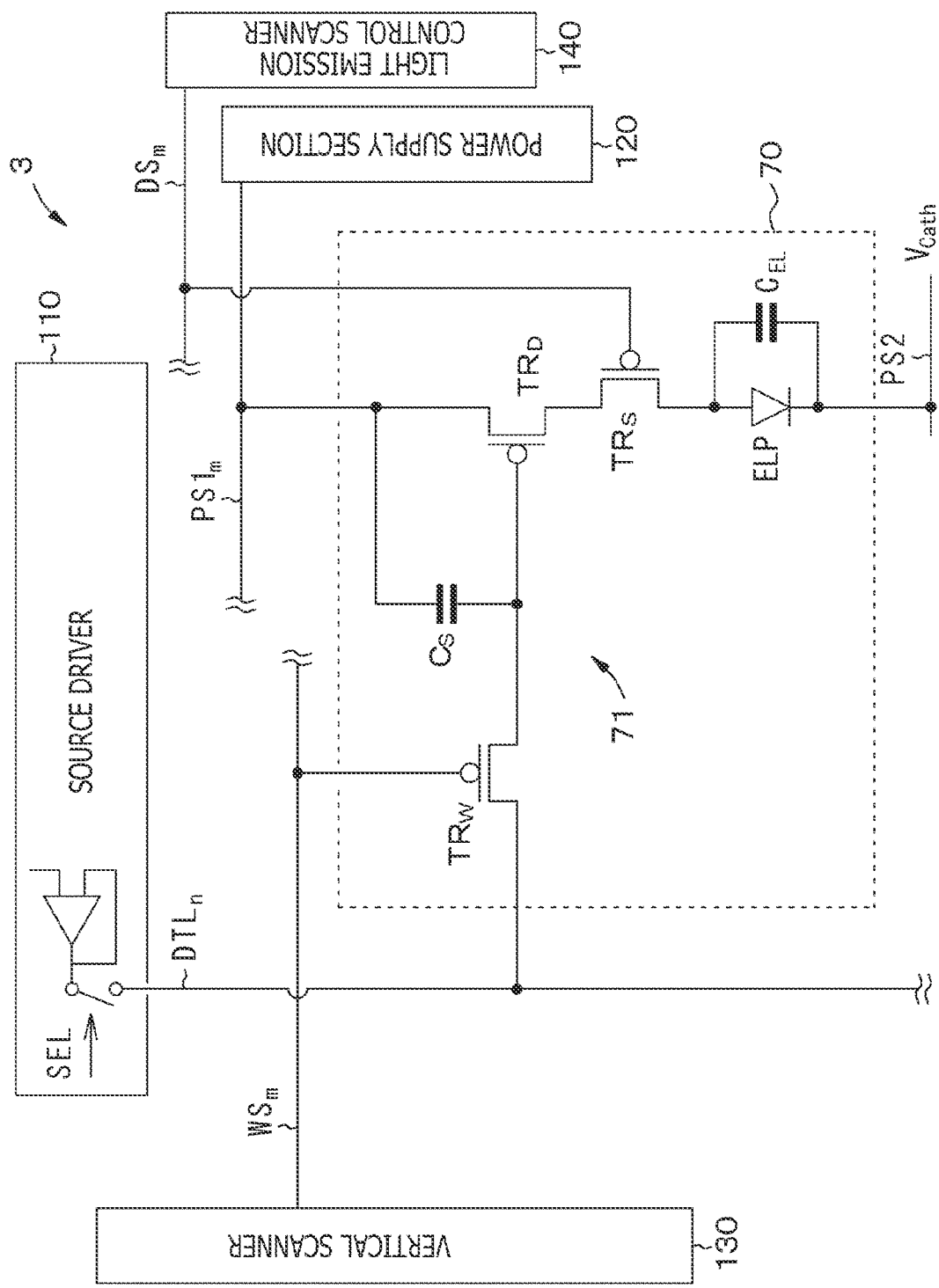
FIG. 2 is an equivalent circuit diagram of a pixel (display element) that includes a light-emitting section and a drive circuit for driving the light-emitting section.

FIG. 2 is an equivalent circuit diagram of a pixel (display element) that includes a light-emitting section and a drive circuit for driving the light-emitting section. Note that, for the sake of illustration, FIG. 2 depicts connection relations of one pixel 70, or in particular, those of the (n, m)th pixel 70.

The pixel 70 includes a current-driven light-emitting section ELP and a drive circuit 71 for driving the light-emitting section ELP. The drive circuit 71 includes a capacity section $C_S$, a drive transistor $TR_D$, and a write transistor $TR_W$, the drive transistor $TR_D$ causing a current corresponding to the voltage held in the capacity section $C_S$ to flow through the light-emitting section ELP, the write transistor $TR_W$ writing a signal voltage to the capacity section $C_S$. The drive circuit 71 further includes a light emission control transistor $TR_S$ for placing the light-emitting section into a non-light-emitting state.

The light-emitting section. ELP is a current-driven light-emitting section of which the light emission luminance varies depending on the value of a flowing current. Specifically, the light-emitting section ELP includes an organic electroluminescence element. The light-emitting section ELP has a known configuration and structure that includes an anode electrode, a hole transport layer, a light-emitting layer, an electron transport layer, and a cathode electrode.

The drive transistor $TR_D$ includes a p-channel type transistor. Further, the write transistor $TR_W$ and the light emission control transistor $TR_S$ each include a p-channel type field effect transistor as well. Alternatively, the write transistor $TR_W$ and the light emission control transistor $TR_S$ may each include an n-channel type field effect transistor.

The capacity section $C_S$ is used to hold the voltage of the gate electrode (what is generally called a gate-to-source voltage) with respect to the source region of the drive transistor $TR_D$. When the pixel 70 emits light, one source/drain region of the drive transistor $TR_D$ (the side connected to the feeder line PS1 in FIG. 2) acts as a source region, and the other source/drain region acts as a drain region. One electrode and another electrode constituting the capacity section $C_S$ are connected respectively to the one source/drain region and the gate electrode of the drive transistor $TR_D$. The other source/drain region of the drive transistor $TR_D$ is connected to the anode electrode of the light-emitting section ELP via the light emission control transistor $TR_S$.

The light emission control transistor $TR_S$ is controlled by the light emission control line DS provided for each of the pixel rows arrayed in the row direction. The gate electrode of the light emission control transistor $TR_S$ is connected with the light emission control line DS. A control signal from the light emission control line DS causes the light emission control transistor $TR_S$ to switch between a conductive state and a non-conductive state. With the light emission control transistor $TR_S$ in the non-conductive state, the drive transistor $TR_D$ and the light-emitting section ELP are electrically disconnected from each other. This places the light-emitting section ELP into the non-light-emitting state. The period during which the light emission control transistor $TR_S$ places the pixel row in the non-light-emitting state may be arranged to be fixed. Alternatively, the period during which the light emission control transistor $TR_S$ holds the pixel row in the non-light-emitting state may be arranged to be variable. As explained above, it is assumed here that, after the voltage of the data line DTL is written to pixels 70, the pixels 70 are placed in the light-emitting state for approximately half of a single-frame period and that thereafter, the pixels 70 are placed in the non-light-emitting state for approximately another half of the single-frame period.

The write transistor $TR_W$ has a gate electrode connected with the scanning line WS, one source/drain region connected with the data line DTL, and the other source/drain region connected with the gate electrode of the drive transistor $TR_D$.

One end of the light-emitting section ELP (specifically, cathode electrode) is connected with the common feeder line PS2. The common feeder line PS2 is supplied with a predetermined voltage $V_{Cath}$ (e.g, grounding potential). Note that the capacity of the light-emitting section ELP is indicated by a reference sign $C_{EL}$. In a case where the capacity $C_{EL}$ of the light-emitting section PIP is too small to drive the pixels 70, an auxiliary capacity for connection in parallel with the light-emitting section TIP may be provided as needed.

Figure 3:
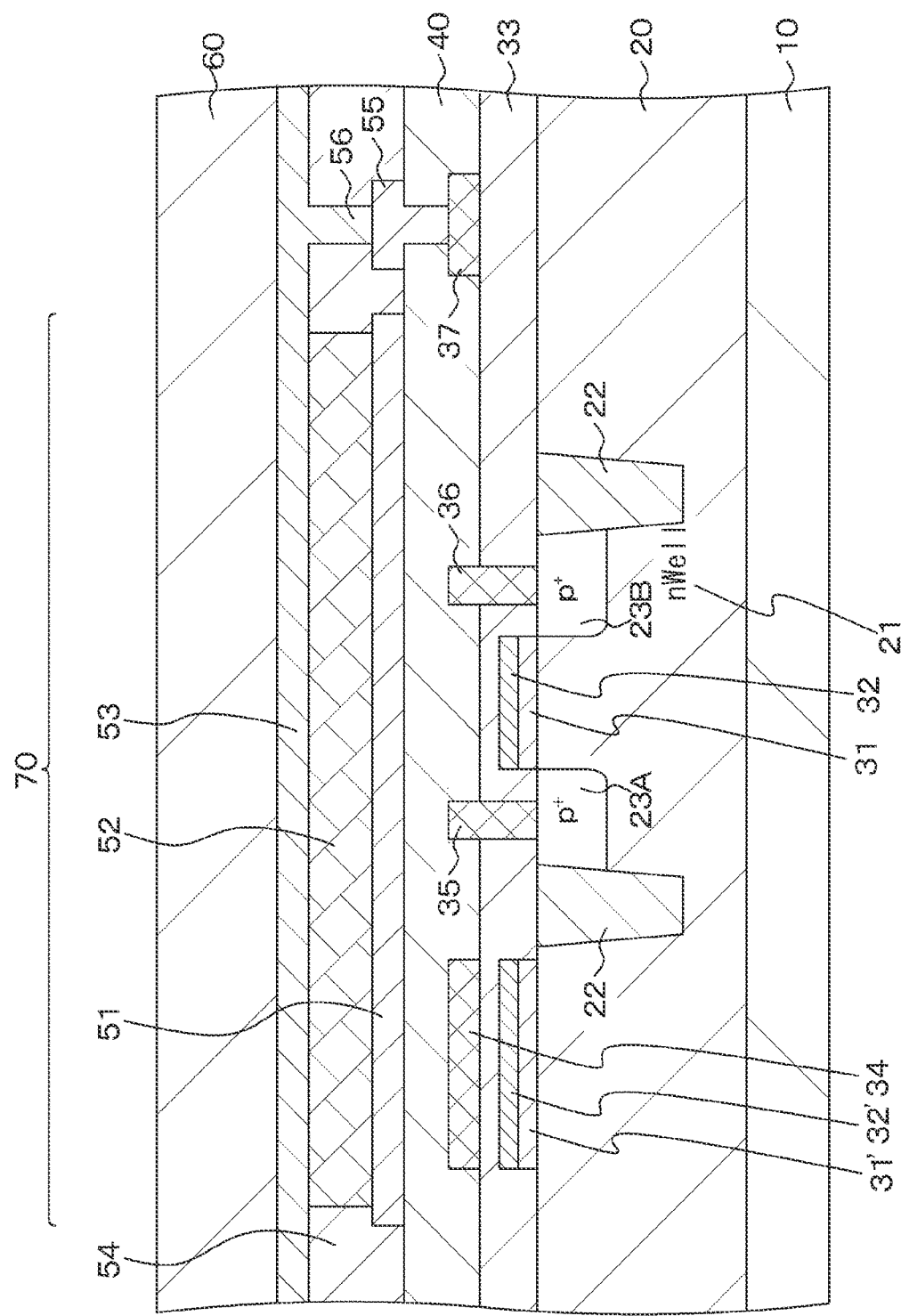
FIG. 3 is a schematic partial cross-sectional view of a portion of a pixel array section including a pixel.

What follows is a description of three-dimensional layout relations of the light-emitting section ELP and transistors. FIG. 3 is a schematic partial cross-sectional view of a portion of the pixel array section including a pixel.

A pixel circuit constituting a pixel 70 is formed, for example, on a semiconductor substrate (indicated by reference sign 100 in FIG. 1) formed by a semiconductor layer 20 made of silicon on a base material 10. More specifically, the drive transistor $TR_D$, the write transistor $TR_W$, and the light emission control transistor $TR_S$ are provided in an n-channel type well 21 formed in the semiconductor layer 20. Note that, for the sake of illustration, FIG. 3 depicts solely the drive transistor $TR_D$. Reference signs 23A and 23B indicate a pair of source/drain regions of the drive transistor $TR_D$.

Each transistor is surrounded by element isolation regions 22. A reference sign 32 stands for the gate electrode of the transistor $TR_D$ and a reference sign 31 for the gate insulating layer. As will be discussed later with reference to FIG. 10 among others, the transistors are formed isolated from each other by the element isolation regions 22, on the semiconductor substrate. Note that, for the sake of illustration, the reference sign 32 indicates the gate electrode regardless of the types of transistors, in FIGS. 10, 17, 18, and 19, to be discussed later.

The other electrode 32' constituting the capacity section $C_S$ is constituted of the same material layer as that of the gate electrode 32. The electrode 32' is formed on an insulating layer 31 made of the same material layer as that of the gate insulating layer 31. An interlayer dielectric layer 33 is formed all over the semiconductor layer 20 that includes the gate electrode 32 of the drive transistor $TR_D$ and the electrode 32'. The electrode 32' and an electrode 34, to be discussed later, are arranged to be opposed to each other with the interlayer dielectric layer 33 interposed therebetween.

One source/drain region 23A of the drive transistor $TR_D$ is connected with the feeder line PS1 and the electrode 34 via a contact hole 35 provided in the interlayer dielectric layer 33. It is to be noted that the connection parts involved are hidden in FIG. 3. Another interlayer dielectric layer 40 is formed on the interlayer dielectric layer 33.

Provided on the interlayer dielectric layer 40 is the light-emitting section ELP that includes an anode electrode 51, a hole transport layer, a light-emitting layer, as electron transport layer, and a cathode electrode 53. Note that, in the drawing, a single layer 52 represents the hole transport layer, the light-emitting layer, and the electron transport layer. A second interlayer dielectric layer 54 is provided on that portion of the interlayer dielectric layer 40 where the light-emitting section ELP is not provided. A transparent substrate 60 is arranged over the second interlayer dielectric layer 54 and the cathode electrode 53. The light generated by the light-emitting layer is emitted outside through the substrate 60.

The anode electrode 51 is connected with the other source/drain region 23B of the drive transistor $TR_D$ via a contact hole 36 provided in the interlayer dielectric layer 33 as well as via the light emission control transistor $TR_S$, not depicted. It is to be noted that, in FIG. 3, the connection parts involved are hidden.

Also, the cathode electrode 53 is connected with wiring 37 (corresponding to the common feeder line PS2 supplied with the voltage $V_{Cath}$) on an extending portion of the interlayer dielectric layer 33 via contact holes 56 and 55 provided in the second interlayer dielectric layer 54 and the interlayer dielectric layer 40.

The foregoing is the description of three-dimensional layout relations of the light-emitting section ELP and transistors. What follows is a description of a method of driving a display apparatus as a reference example designed to help understanding of the present disclosure.

Figure 4:
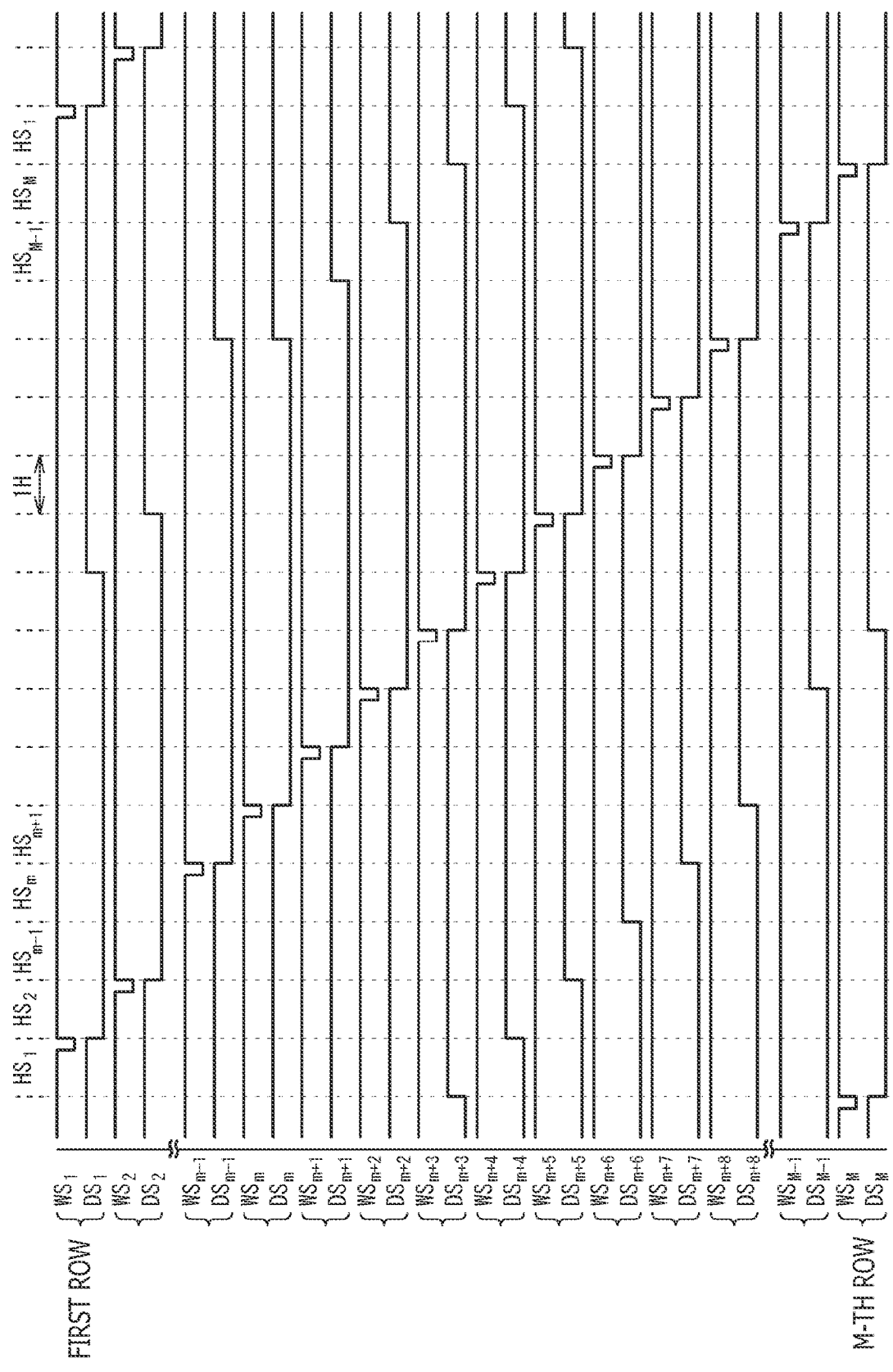
FIG. 4 is a schematic timing chart explaining the operations of a method of driving a reference example.
Figure 5:
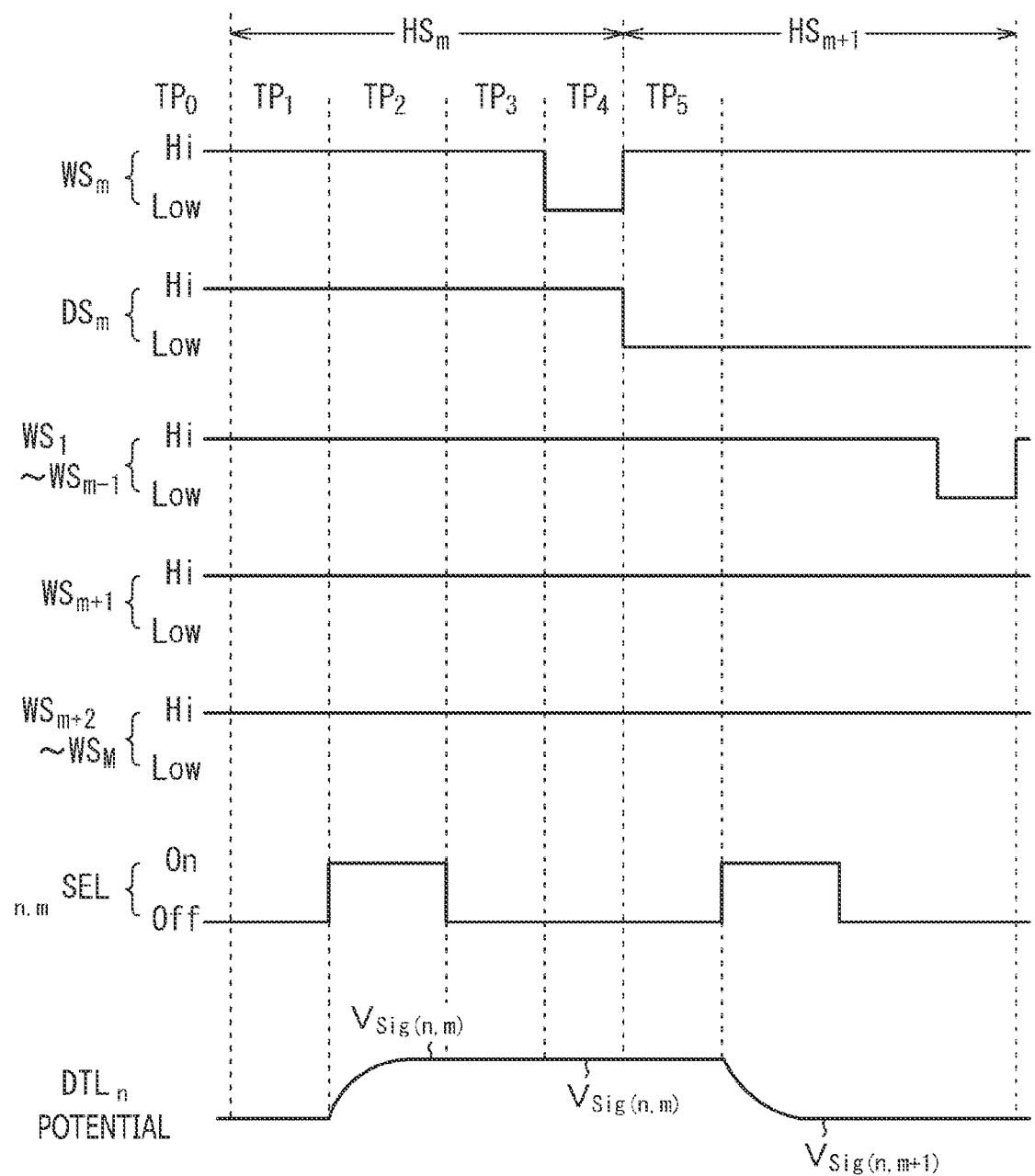
FIG. 5 is a schematic timing chart explaining the operations in an (n, m)th pixel.

FIG. 4 is a schematic timing chart explaining the operations of the method of driving the reference example. FIG. 5 is a schematic timing chart explaining the operations in the (n, m)th pixel.

Figure 6A:
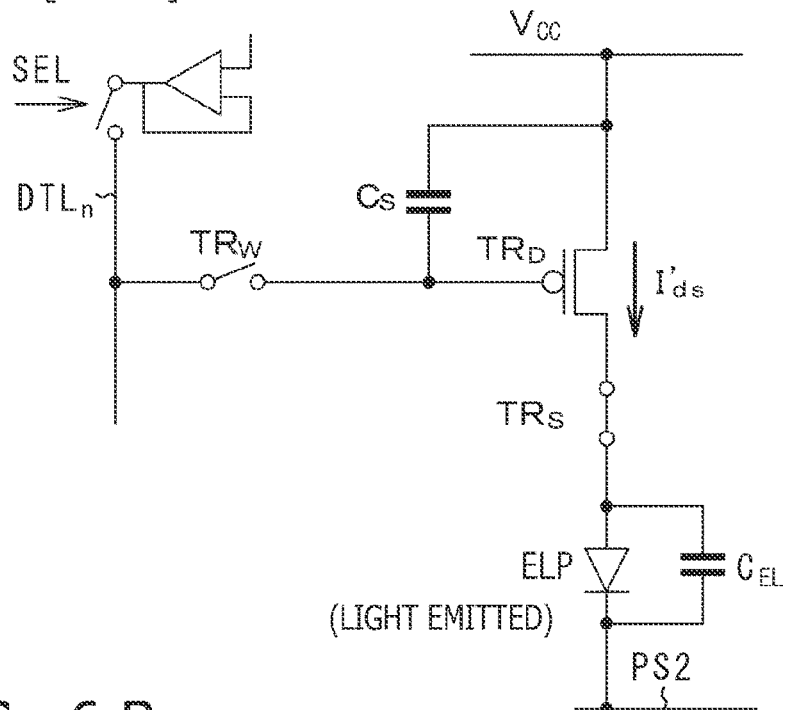
FIGS. 6A and 6B are schematic operation diagrams explaining the method of driving the reference example operating a pixel.

Described below in detail with reference to FIGS. 5 to 9 are the operations performed on the (n, m)th pixel 70 according to the method of driving the reference example.
[Time Period TP0] (FIGS. 5 and 6A)

The [time period TP0] represents an operation in the preceding display frame, for example. A drain current $I'_{ds}$ based on the above-cited expression (1) flows through the light-emitting section ELP of the (n m)th pixel 70. The luminance value of the (n, m)th pixel 70 corresponds to the drain current $I'_{ds}$.

Figure 6B:
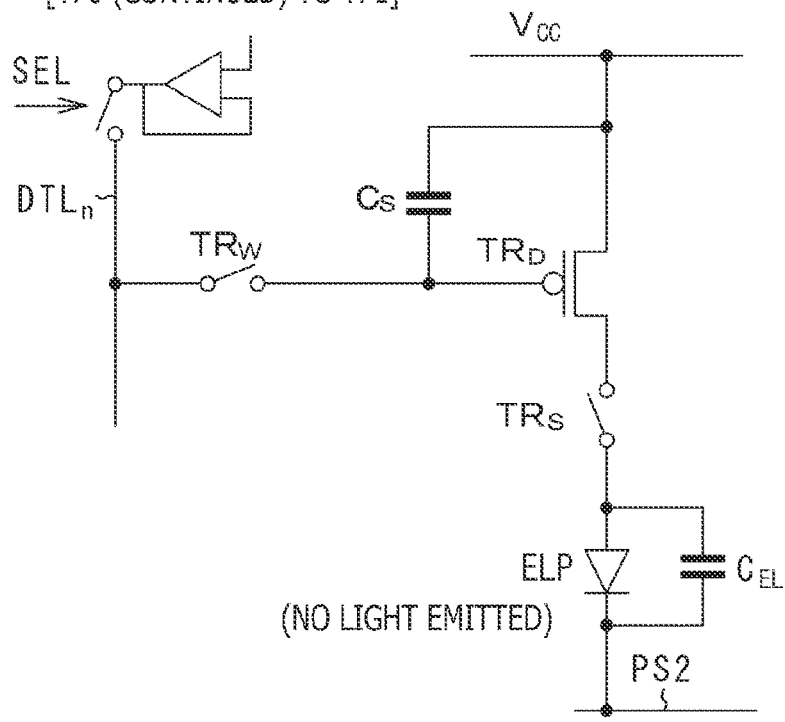

Here, the data line $DTL_n$ is in a state of being disconnected from the source driver 110, the write transistor $TR_W$ is in the non-conductive state, and the light emission control transistor $TR_S$ is in the conductive state. The light-emitting state of the (n, m)th display element 10 is maintained while the scan pulse supplied via the light emission control line $DS_m$ is being active (the active state is a low voltage state).
[Time Period TP0 (Continued) to Time Period TP1] (FIGS. 5 and 6B)

Figure 7A:
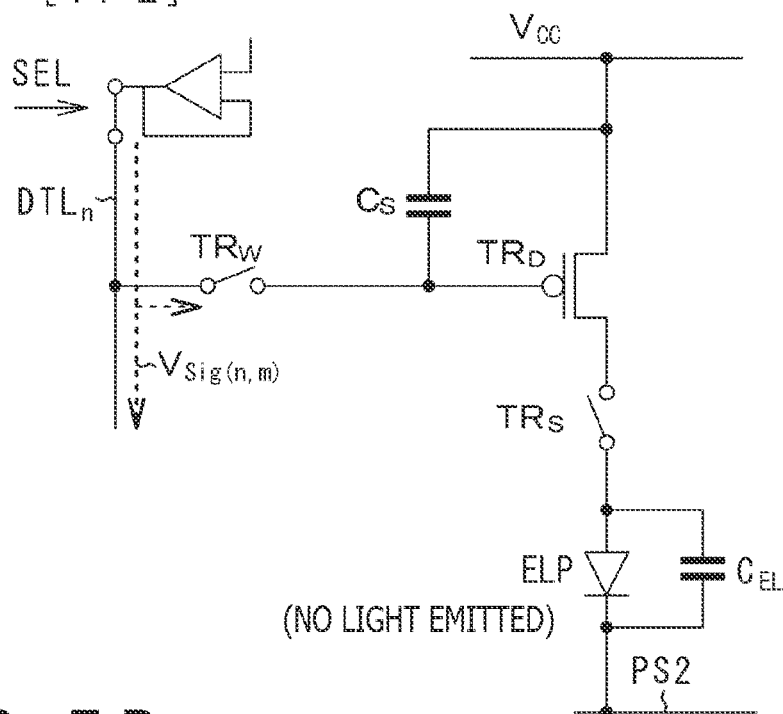
FIGS. 7A and 7B are schematic operation diagrams continuing from FIG. 6B and explaining the method of driving the reference example operating a pixel.

The scan pulse supplied via the light emission control line $DS_m$ becomes non-active (the non-active state is a high-voltage state), placing the light emission control transistor $TR_S$ into the non-conductive state. With the light-emitting section ELP cut off from the current flow, the pixel 70 is in the non-light-emitting state.
[Time Period TP2] (FIGS. 5 and 7A)

Figure 7B:
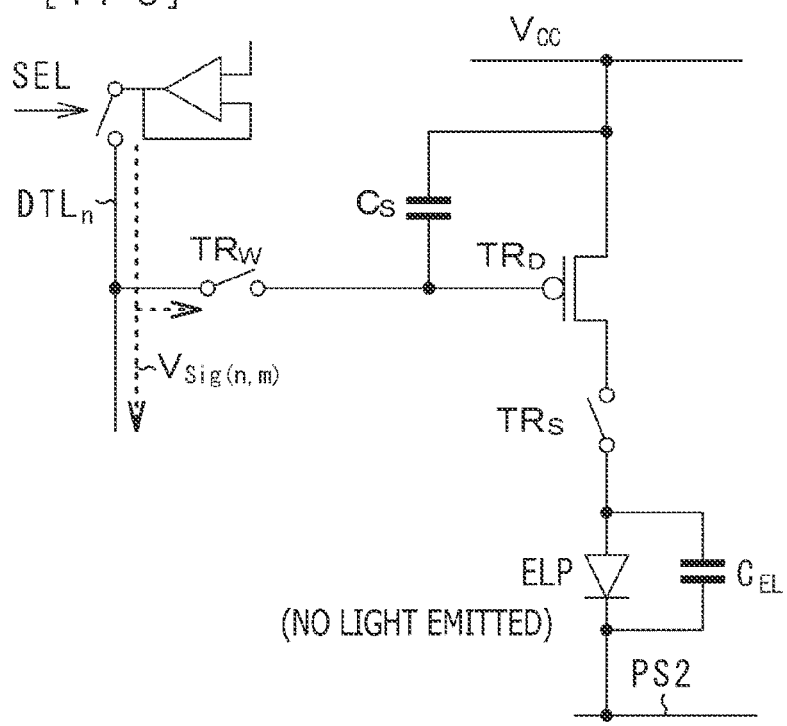

In the [time period TP2], the data line $DTL_n$ is connected with the source driver 110. The data line $DTL_n$ is supplied with a video signal voltage $V_{Sig(m, m)}$ corresponding to the (n, m)th pixel 70. The write transistor $TR_W$ and the light emission control transistor $TR_S$ are held in the non-conductive state.
[Time Period TP3] (FIGS. 5 and 7B)

Figure 8A:
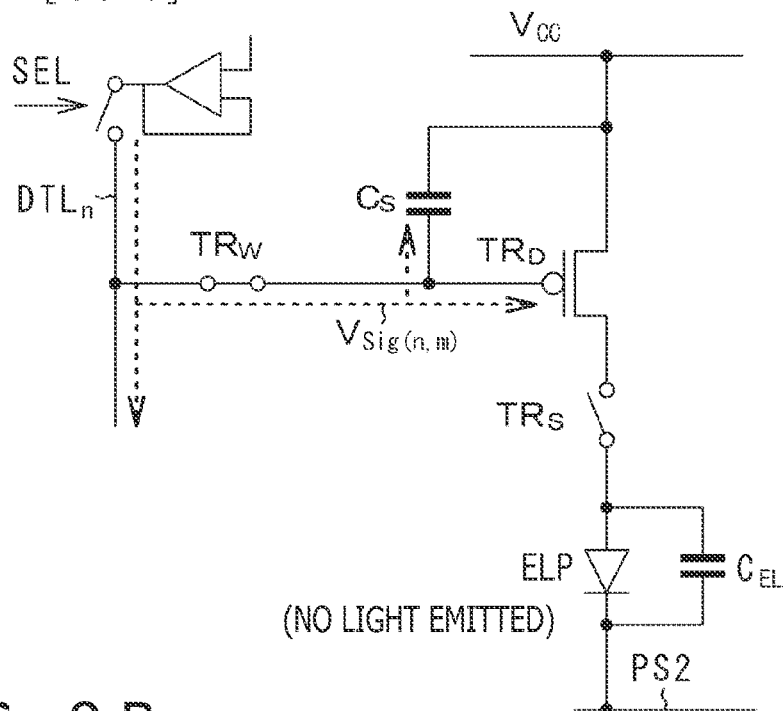
FIGS. 8A and 8B are schematic operation diagrams continuing from FIG. 7B and explaining the method of driving the reference example operating a pixel.
Figure 8B:
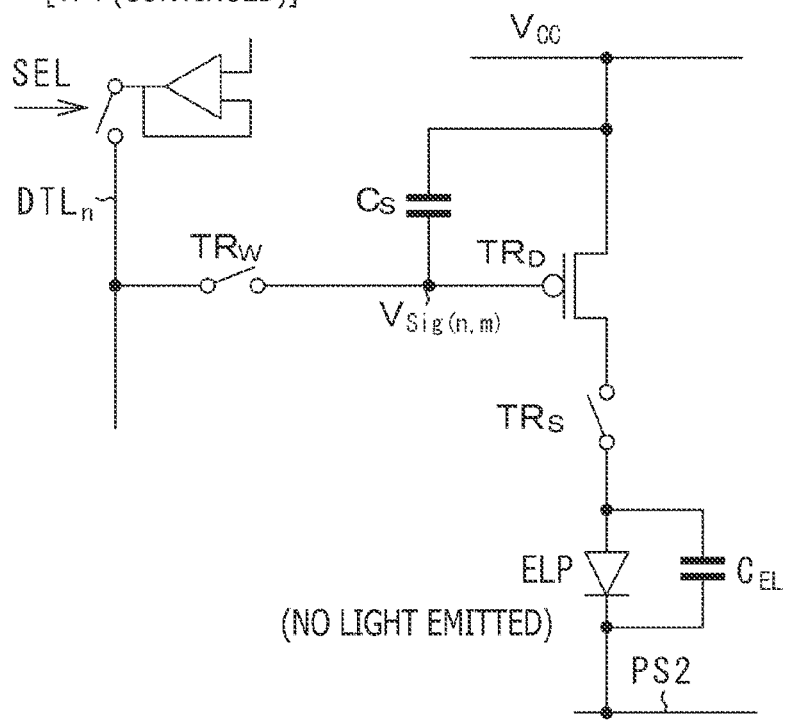

As depicted in FIG. 5, during the [time period TP3] through the [time period TP5], the data line DTL, is in a state of being disconnected from the source driver 110. The video signal voltage $V_{Sig(n, m)}$ is in a state of being held by the data line $DTL_n$. The write transistor $TR_W$ and the light emission control transistor $TR_S$ are held in the non-conductive state.
[Time Period TP4] (FIGS. 5, 8A, and 8B)

The scan pulse supplied via the scanning line WS, becomes active, placing the write transistor $TR_W$ into the conductive state. The light emission control transistor $TR_S$ is held in the non-conductive state.

Figure 9:
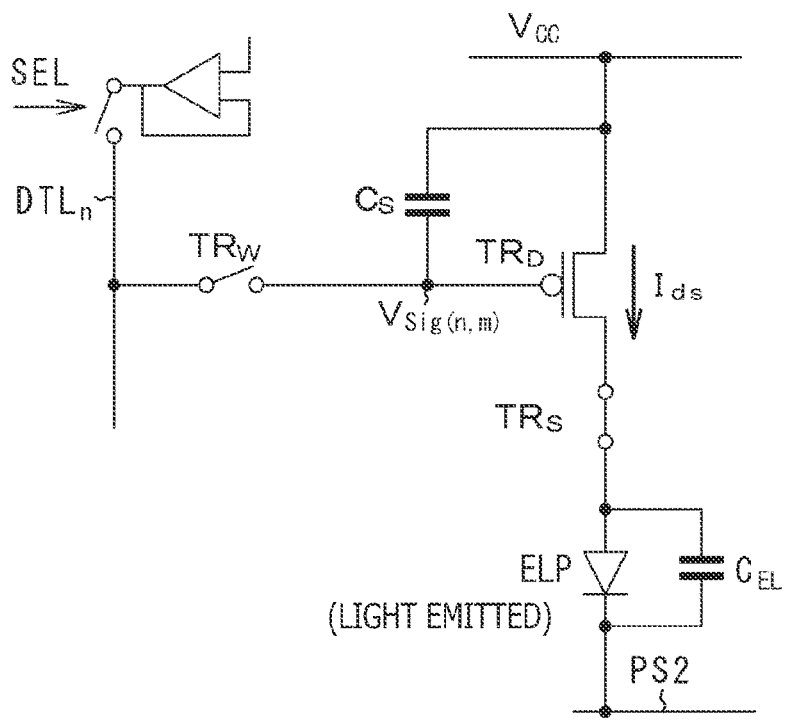
FIGS. 9A and 9B are schematic operation diagrams continuing from FIG. 8B and explaining the method of driving the reference example operating a pixel.

The gate electrode of the drive transistor $TR_D$ and one end of the capacity section $C_S$ are connected with the data line $DTL_n$. This connection causes the video signal voltage $V_{Sig(n, m)}$ to be written to the pixel 70 (see FIG. 8A). Then, toward the end of the [time period TP4], the scan pulse supplied via the scanning line WS, becomes non-active, placing the write transistor $TR_W$ into the non-conductive state (see FIG. 80). The capacity section. $C_S$ holds the gate electrode of the drive transistor $TR_D$ in a state of being supplied with the video signal voltage $V_{Sig(n, m)}$.
[Time Period TP5] (FIGS. 5 and 9)

The scan pulse supplied via the light emission control line $DS_m$ becomes active, placing the light emission control transistor $TR_2$ into the conductive state. A current defined by the following expression (2) in which $V_{Sig(n, m)}$ replaces $V_{Sig}$ is the above-cited expression (1) flows through the light-emitting section ELP:

$$I_{ds}=k\cdot\mu\cdot((V_{CC}-V_{Sig(n,m)})-|V_{th}|)^2 \qquad (2)$$

This state is maintained for approximately half of a single-frame period. Thereafter, as depicted in FIG. 6B, the light emission control transistor $TR_S$ enters the non-conductive state, allowing the operations of the [time period TP1] through the [time period TP5] to be repeated.

The foregoing is the detailed description of the operations in the (n, m)th pixel 70 according to the method of driving the reference example.

What follows is a detailed description of the operations of the first embodiment. First, a typical capacity between the scanning line WS and the data line DTL is explained in order to facilitate understanding.

Figure 10:
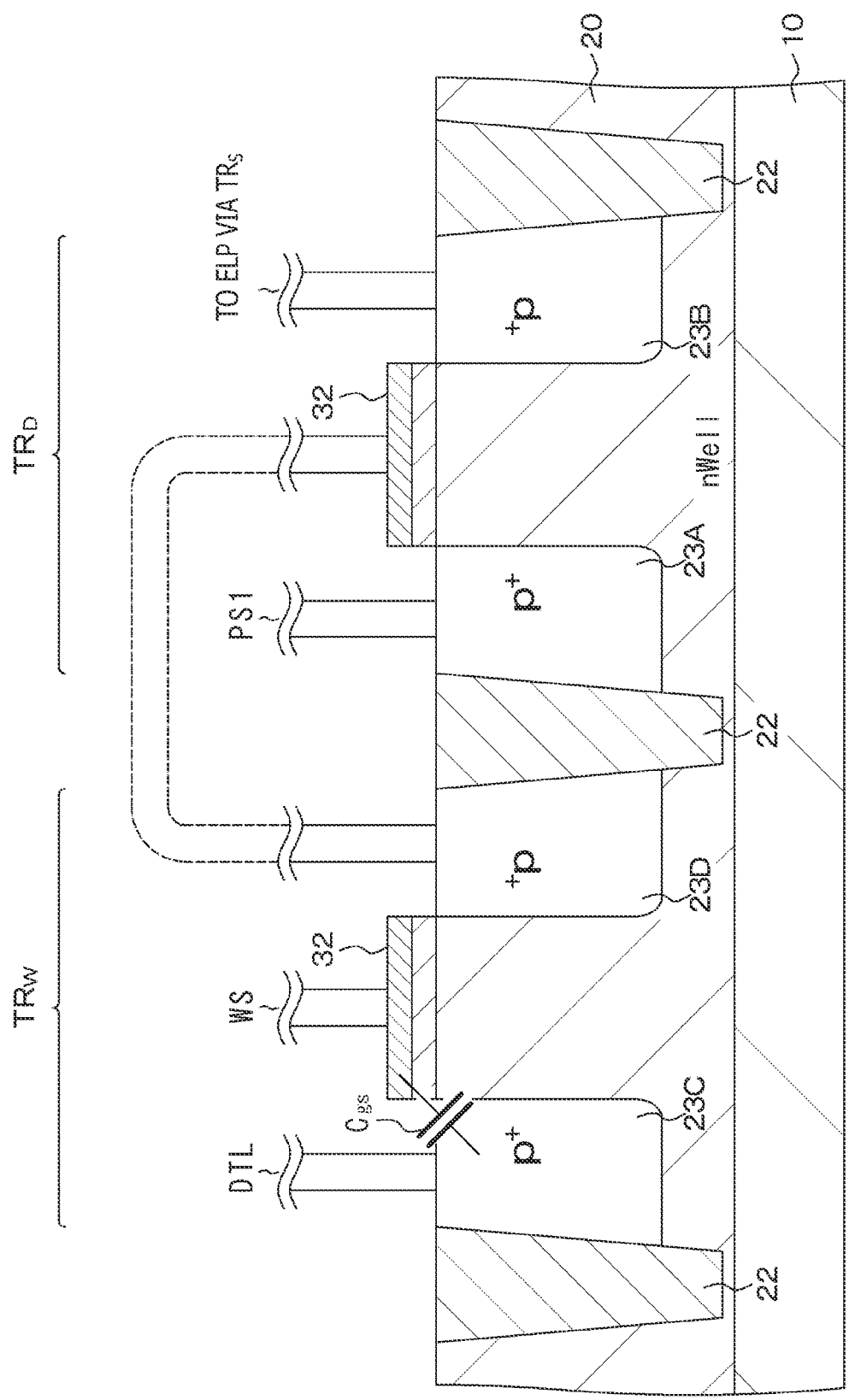
FIG. 10 is a schematic cross-sectional view explaining a cross-section structure of transistors in a drive circuit for driving a light-emitting section.

FIG. 10 is a schematic cross-sectional view explaining a cross-section structure of transistors in the drive circuit for driving the light-emitting section.

As depicted in FIG. 10, the drive transistor $TR_D$ and the write transistor $TR_W$ are formed separated by the element isolation regions 22, on the semiconductor substrate. Note that, although the light emission control transistor $TR_S$ is likewise formed, it is not depicted in the drawing for the sake of illustration.

The other source/drain region 23D of the write transistor $TR_W$ and the one source/drain region 23A of the drive transistor $TR_D$ are formed to be opposed to each other with the element isolation regions 22 interposed therebetween. The element isolation regions 22 are formed in an STI (Shallow Trench Isolation) structure in which insulating materials are embedded in grooves dug on the surface of the semiconductor substrate.

In the write transistor $TR_W$, one source/drain region 23C is connected with the data line $DTL_n$, and the gate electrode 32 is connected with the scanning line $WS_m$. There exists a gate-to-source capacity $C_{gs}$ between the gate electrode of the write transistor $TR_W$ on one hand and one source/drain region thereof on the other hand. The capacity $C_{gs}$ functions as a capacity between the data line DTL and the scanning line WS.

Thus, when the data line $DTL_n$ in a state of being disconnected from the source driver 110 changes the voltage of a scanning line WS different from the scanning line $WS_m$, the resulting capacitive coupling varies the voltage of the data line $DTL_n$.

The typical capacity between the scanning line and the data line has been explained above. What follows is a description of the operations of the display apparatus 1 as the first embodiment.

In the display apparatus 1 as the first embodiment, with the video signal voltage in a state of being held on the data line DTL, the voltage of a scanning line WS different from the scanning line WS of the pixel 70 targeted for writing is changed so as to vary the voltage of the data line DTL via the capacity between the data line DTL and the scanning line WS. Thereafter, the scanning line WS of the pixel 70 targeted for writing is driven to write the voltage of the data line DTL to the pixel.

In the display apparatus 1 as the first embodiment, the voltage is changed on at least a portion of the scanning line WS of a pixel row different from the pixel row including the pixel 70 targeted for writing, the different pixel row being held in the non-light-emitting state for a predetermined time period.

FIG. 11 is a schematic timing chart explaining the operations of the display apparatus as the first embodiment. FIG. 12 is another schematic timing chart explaining the operations in the (n, m)th pixel.

As depicted in FIG. 12, with the video signal voltage $V_{Sig(n, m)}$ in a state of being held on the data line $DTL_n$ in the display apparatus 1 of the first embodiment, the voltage is changed on scanning lines (scanning lines $WS_{m+1}$ to $WS_{m+7}$ in the illustrated example) different from the scanning line $WS_m$ of the pixel 70 targeted for writing (see [Time period TP5] in FIG. 12). Then, after the voltage of the data line $DTL_n$ is varied via the capacity between the data line $DTL_n$ and the scanning line WS, the scanning line $WS_m$ of the (n, m)th pixel 70 targeted for writing is driven to write the voltage of the data line $DTL_n$ to the (n, m)th pixel 70.

Described below in detail with reference to FIGS. 12 to 16 are the operations in the (n, m)th pixel of the display apparatus 1 as the first embodiment.

The method of driving the display apparatus 1 as the first embodiment includes the steps of
  causing the data line DTL to hold the video signal voltage,
  then changing the voltage of a scanning line WS different from the scanning line WS of the pixel 70 targeted for writing, in order to vary the voltage of the data line DTL via the capacity between the data line DTL and the scanning line WS, and
  thereafter driving the scanning line WS of the pixel 70 targeted for writing, to write the voltage of the data line DTL to the pixel 70.

[Time Periods TP0 to TP1] (FIG. 12)

The [time period TP0] represents an operation in the preceding display frame, for example. The scan pulse supplied via the light emission control line $DS_m$ causes the display element 10 to switch from the light-emitting state to the non-light-emitting state. The specific operation is basically similar to that of the reference example discussed above with reference to FIGS. 6A and 6B and thus will not be described further. In the [time period TP1], the write transistor $TR_W$ and the light emission control transistor $TR_S$ are in the non-conductive state.

Figure 13A:
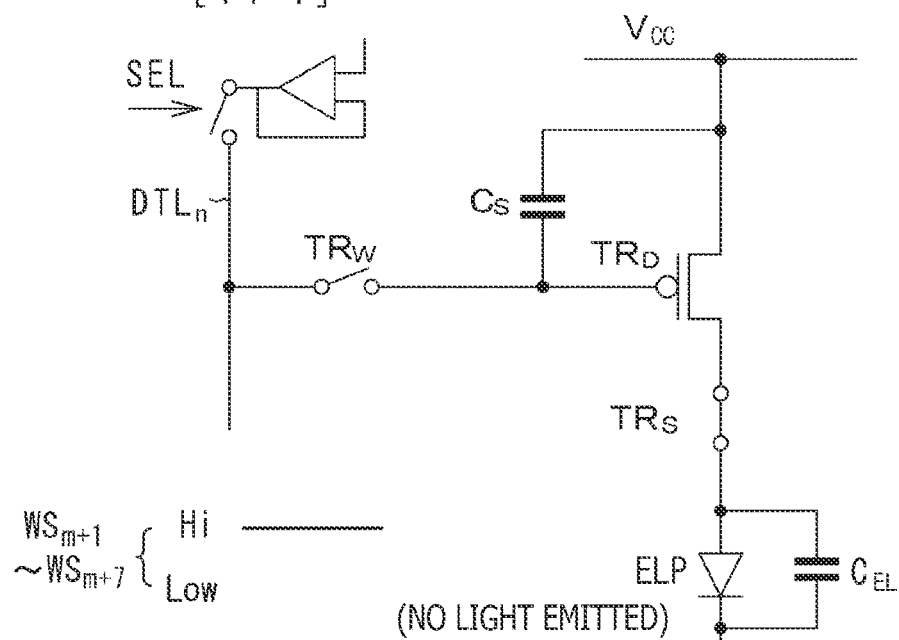
FIGS. 13A and 13E are schematic operation diagrams explaining the operations in a pixel of the display apparatus as the first embodiment.
Figure 13B:
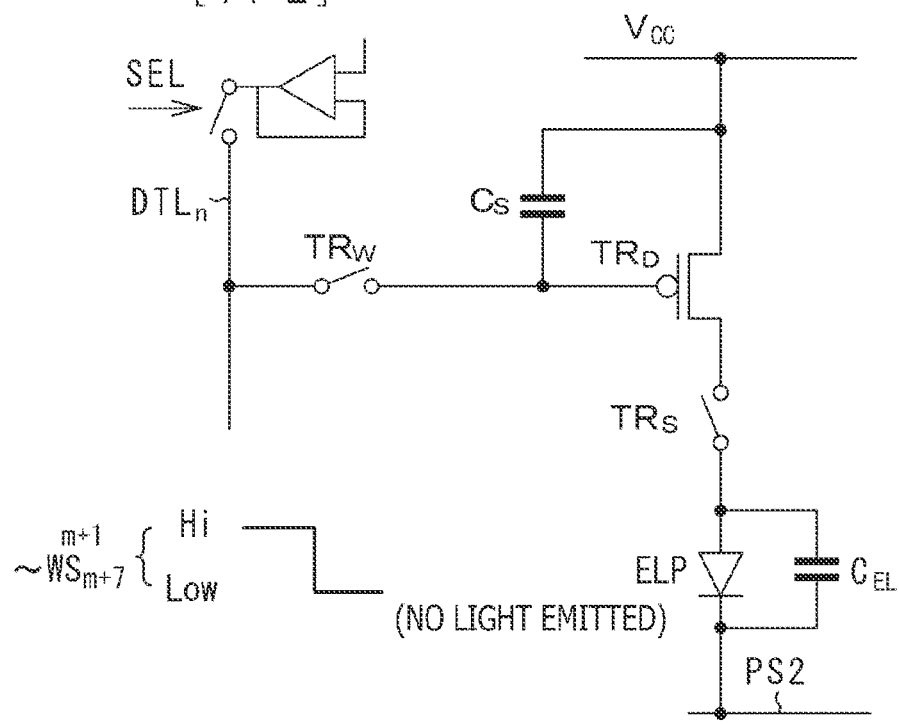

[Time Period TP2] (FIGS. 12 and 13B)

At the beginning of the [time period TP2], scanning lines $WS_{m+1}$ to $WS_{m+7}$ different from the scanning line $WS_m$ of the pixel 70 targeted for writing are switched from the non-active state to the active state. The write transistor $TR_W$ and the light emission control transistor $TR_S$ are in the non-conductive state.

Figure 14A:
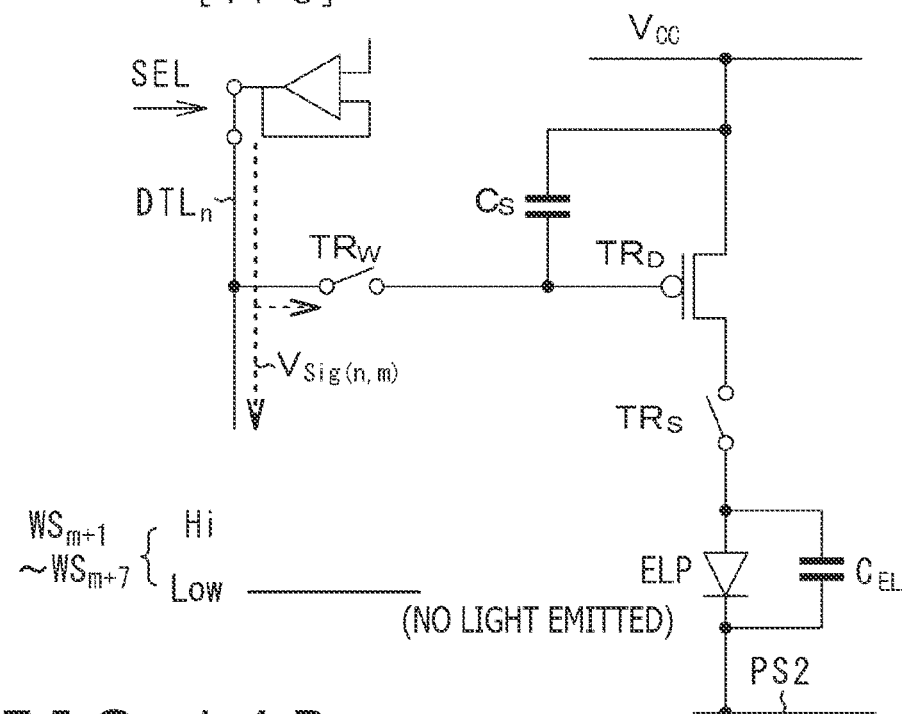
FIGS. 14A and 14B are schematic operation diagram continuing from FIG. 13B and explaining the operations in a pixel of the display apparatus as the first embodiment.

[Time Period TP3] (FIGS. 12 and 14A)

In the [time period TP3], the data line $DTL_n$ is connected with the source driver 110. The data line $DTL_n$ is supplied with the video signal voltage $V_{Sig(m, m)}$ corresponding to the (n, m)th pixel 70. The write transistor $TR_W$ and the light emission control transistor $TR_S$ are held in the non-conductive state.

Figure 14B:
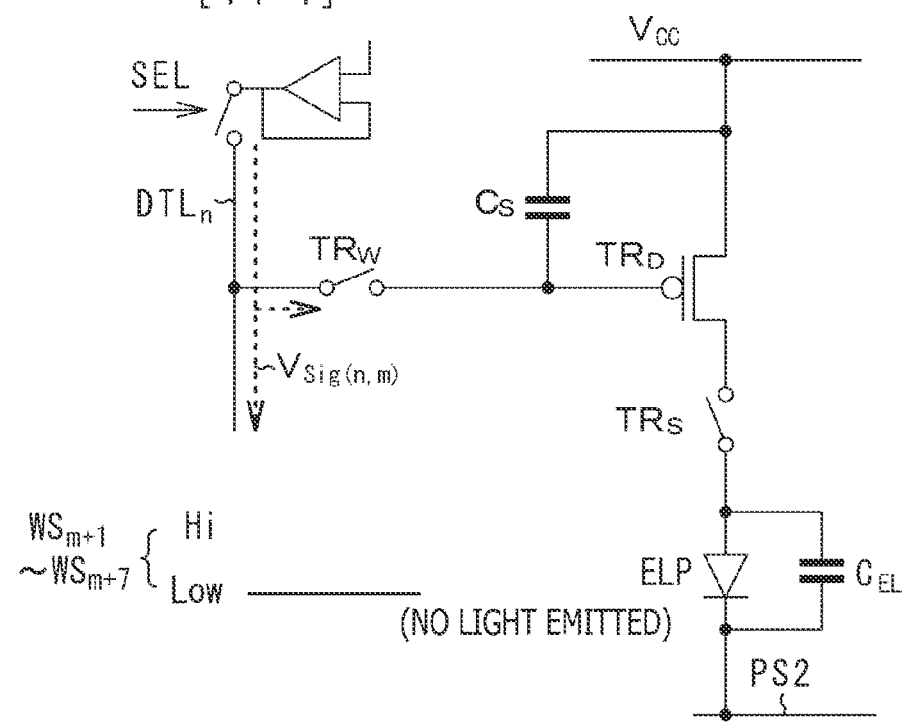

[Time Period TP4] (FIGS. 12 and 14B)

As depicted in FIG. 12, from the beginning of the [time period TP4] through the [time period TP8], the data line $DTL_n$ is held in a state of being disconnected from the source driver 110. In the [time period TP4], the video signal voltage $V_{Sig(n, m)}$ is in a state of being held on the data line $DTL_n$. The write transistor $TR_W$ and the light emission control transistor $TR_S$ are held in the non-conductive state.

Figure 15A:
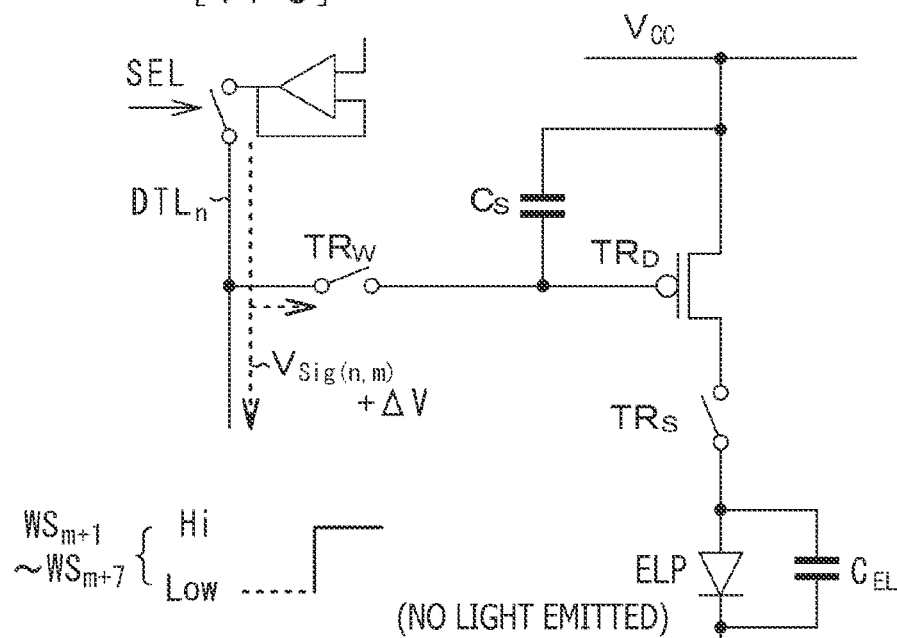
FIGS. 15A and 15B are schematic operation diagrams continuing from FIG. 14B and explaining the operations in a pixel of the display apparatus as the first embodiment.

[Time Period TP5] (FIGS. 12 and 15A)

At the beginning of this period, the scanning lines $WS_{m+1}$ to $WS_{m+7}$ different from the scanning line $WS_m$ of the pixel 70 targeted for writing are switched from the non-active state to the active state. The voltage of the data line $DTL_n$ is varied via the capacity between the data line $DTL_n$ on one hand and the scanning lines $WS_{m+1}$ to $WS_{m+7}$ on the other hand. If a reference sign $\Delta V$ stands for the amount of voltage variation, the voltage held on the data line $DTL_n$ is defined as $V_{Sig(n, m)}+\Delta V$. The write transistor $TR_N$ and the light emission control transistor $TR_S$ are held in the non-conductive state.

Figure 15B:
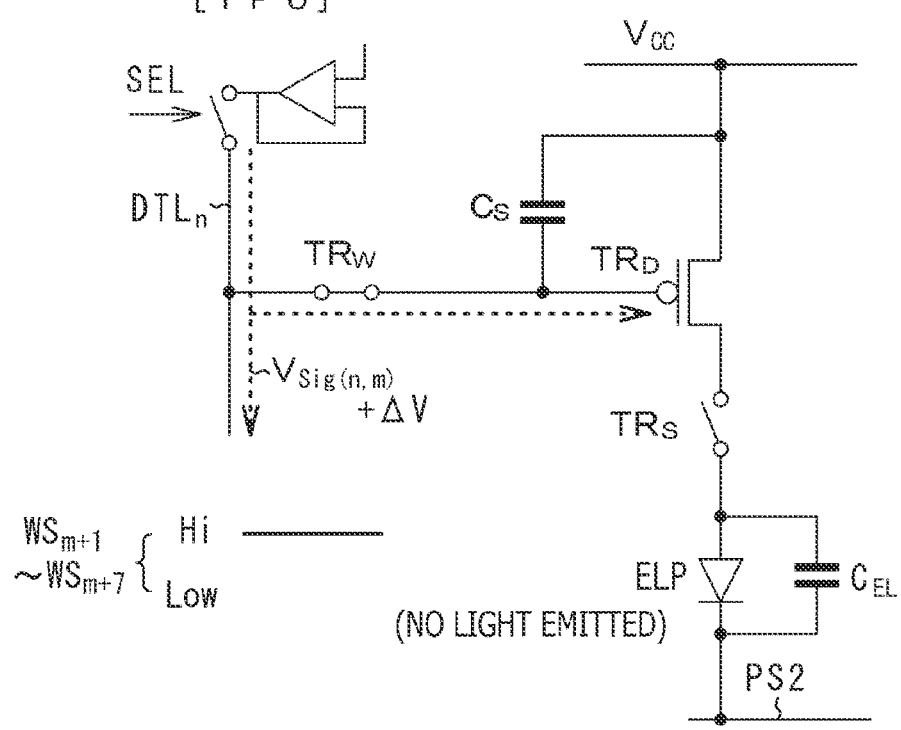
Figure 16A:
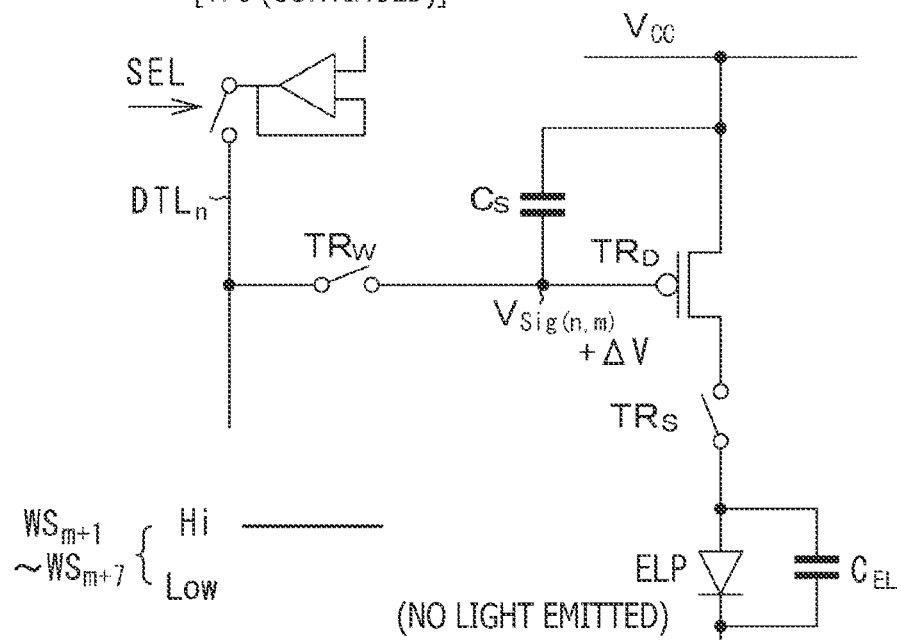
FIGS. 16A and 16B are schematic operation diagrams continuing from FIG. 15B and explaining the operations in a pixel of the display apparatus as the first embodiment.

[Time Period TP6] (FIGS. 12, 15B, and 16A)

The scan pulse supplied via the scanning line $WS_m$ becomes active, placing the write transistor $TR_W$ into the conductive state. The light emission control transistor $TR_S$ is held in the non-conductive state.

The gate electrode of the drive transistor $TR_D$ and the other end of the capacity section $C_S$ are connected with the data line $DTL_n$. This connection causes the voltage $V_{Sig(n, m)}+\Delta V$ held on the data line $DTL_n$ to be written to the pixel 70 (see FIG. 15B). Then, toward the end of the [time period TB6], the scan pulse supplied via the scanning line $WS_m$ becomes non-active, placing the write transistor $TR_W$ into the non-conductive state (see FIG. 16A). The capacity section $C_S$ holds the gate electrode of the drive transistor $TR_D$ in a state of being supplied with the voltage $V_{Sig(n, m)}+\Delta V$.

Figure 16B:
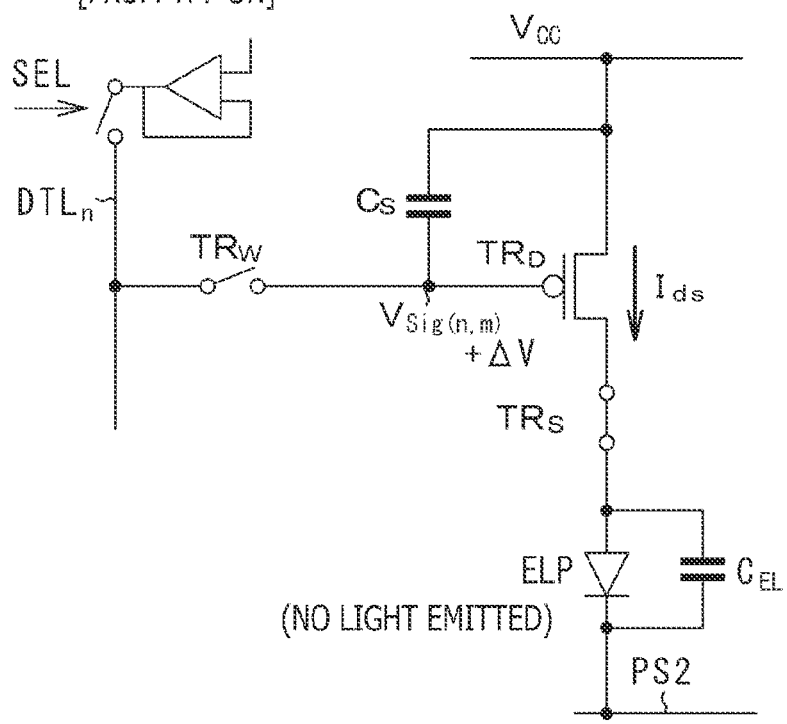

[Time Period TP7] (FIGS. 12 and 16B)

The scan pulse supplied via the light emission control line $DS_m$ becomes active, placing the light emission control transistor $TR_S$ into the conductive state. A current defined by the following expression (3) in which $V_{Sig(n, m)}+\Delta V$ replaces $V_{Sig}$ the above-cited expression (1) flows through the light-emitting section ELP:

$$I_{ds}=k\cdot\mu\cdot((V_{CC}-V_{Sig(n,m)}+\Delta V)-|V_{th}|)^2 \quad (3)$$

This state is maintained for approximately half of a single-frame period. Thereafter, as depicted in FIG. 6B, the light emission control transistor $TR_S$ enters the non-conductive state, allowing the operations of the [time period TP1] through the [time period TP5] to be repeated.

The foregoing is the detailed description of the operations in the (n, m)th pixel 70 of the display apparatus 1 as the first embodiment.

In the operations of the reference example, the gate electrode of the drive transistor $TR_D$ is supplied with the video signal voltage unchanged as supplied from the source driver 110. In the first embodiment, by contrast, the gate electrode of the drive transistor $TR_D$ may be supplied with a voltage exceeding the video signal voltage supplied from the source driver 110. Thus, the Gate electrode of the drive transistor $TR_D$ may be supplied with a voltage in excess of a maximum voltage supplied from the source driver 110.

The amount of voltage variation ΔV indicated in FIG. 12 can be controlled by changing the voltage of an appropriately determined number of scanning lines WS different from the scanning line $WS_m$ of the pixel 70 targeted for writing, in the [time period. TP5] indicated in FIG. 12. Thus, the amount of voltage variation ΔV can be variably controlled by setting variably an appropriate number of the scanning lines WS targeted for voltage variation, the scanning lines WS being different from the scanning line WS of the pixel 70 targeted for writing.

If pulses other than the write pulse are fed to the scanning line WS of the pixel in the light-emitting period, the display will be disturbed. Thus, in order to expand the variable range of the amount of voltage variation ΔV, it is preferred that the length of the non-light-emitting period be variably changed and that the number of the scanning lines WS targeted for voltage variation further be set variably.

Furthermore, in order to expand the variable range of the amount of voltage variation ΔV, it is preferable to increase the capacity between the data line DTL and the scanning line WS. Described below with reference to some of the drawings is a configuration in which the capacity between the data line DTL and the scanning line WS is increased.

Figure 17:
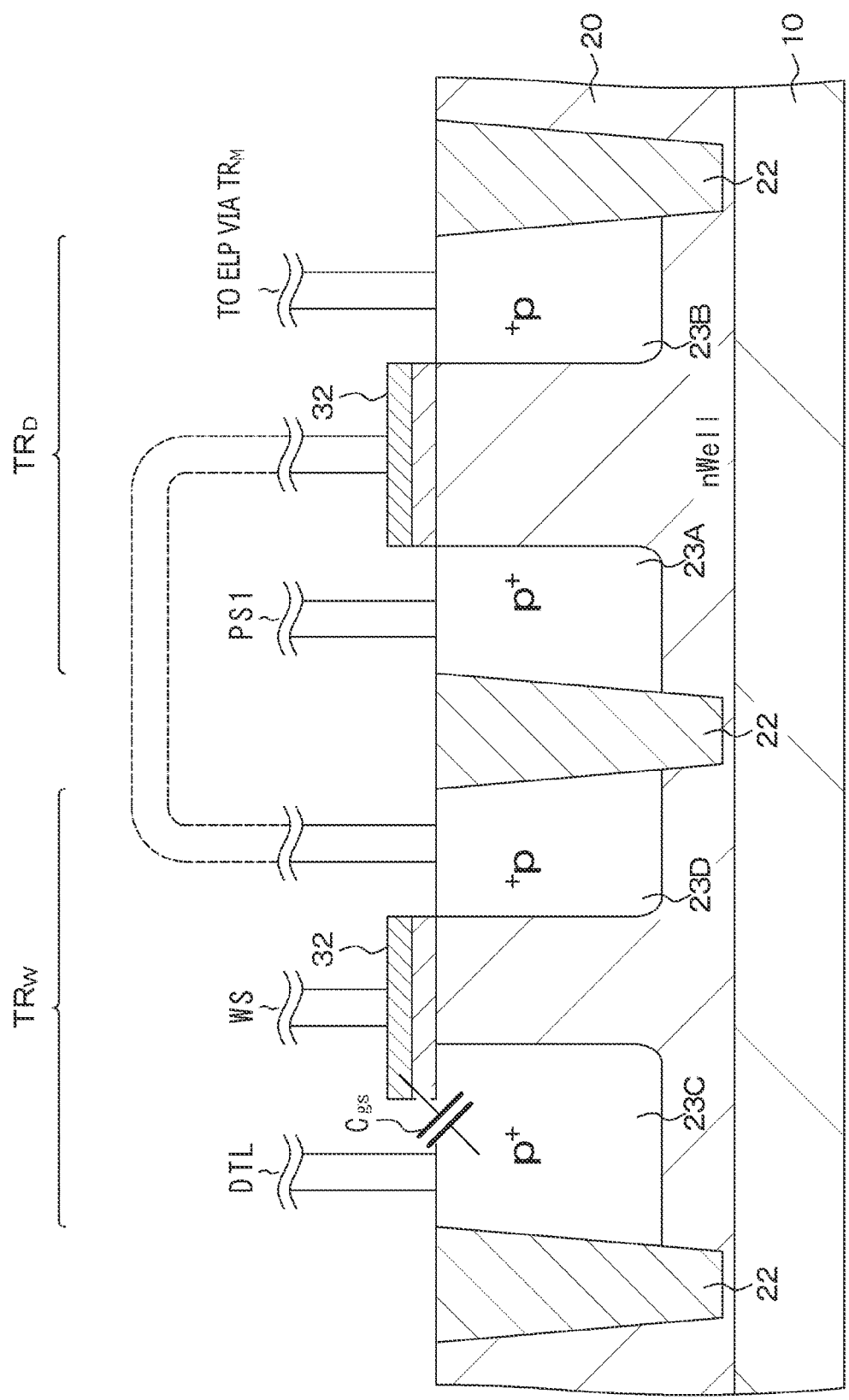
FIG. 17 is a schematic partial cross-sectional view explaining another typical cross-section structure of transistors in a drive circuit.

FIG. 17 depicts a typical configuration where the capacity between a data line and a scanning line is increased. The write transistor $TR_W$ is configured in such a manner that the amount of overlap between one source/drain region and the gate electrode is larger than the amount of overlap between the other source/drain region and the gate electrode. This configuration increases the gate-to-source capacity $C_{gs}$, which results in an increase of the capacity between the data line DTL and the scanning line WS.

Figure 18:
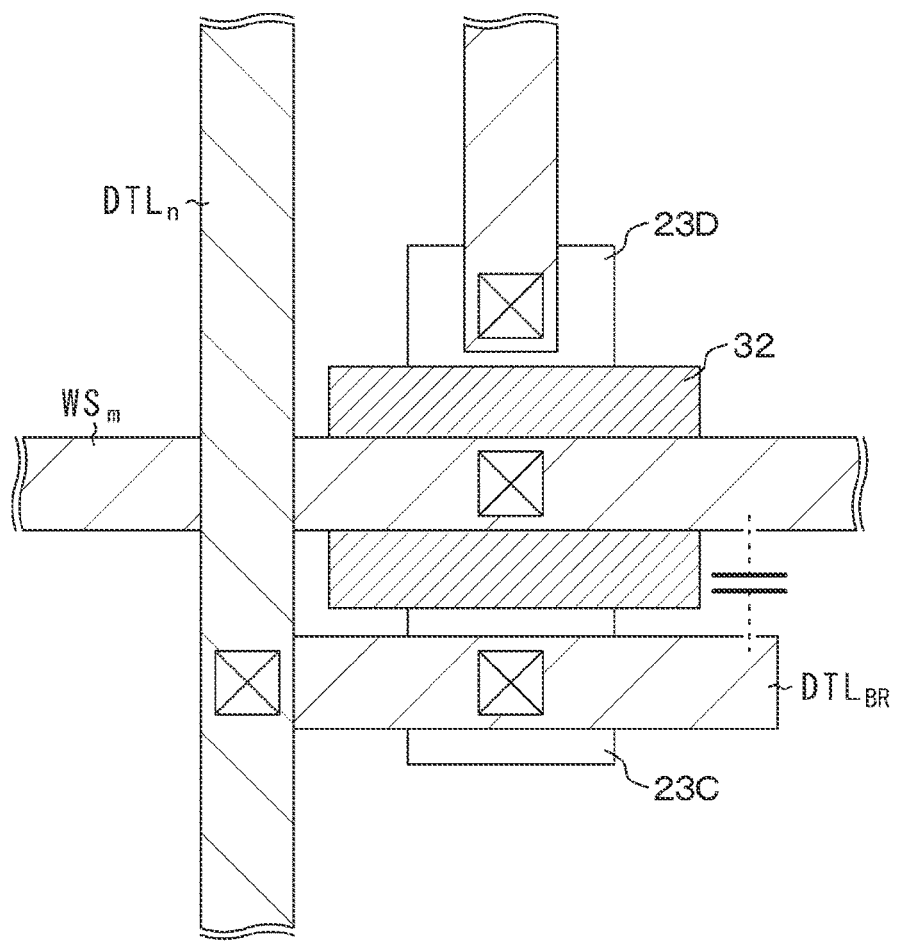
FIG. 18 is a schematic plan view explaining a typical layout of various lines and the like in a drive circuit.

FIG. 18 is a schematic plan view explaining a typical layout of various lines and the like in a drive circuit. In this example, one source/drain region of the write transistor $TR_W$ is connected with a branch line $DTL_{BR}$ extending from the data line $DTL_n$ in parallel with the scanning line $WS_m$. Because the scanning line $WS_m$ and the branch line $DTL_{BR}$ are arranged in parallel with each other, a capacity develops therebetween. As a result, the capacity between the data line DTL and the scanning line WS is increased.

Figure 19:
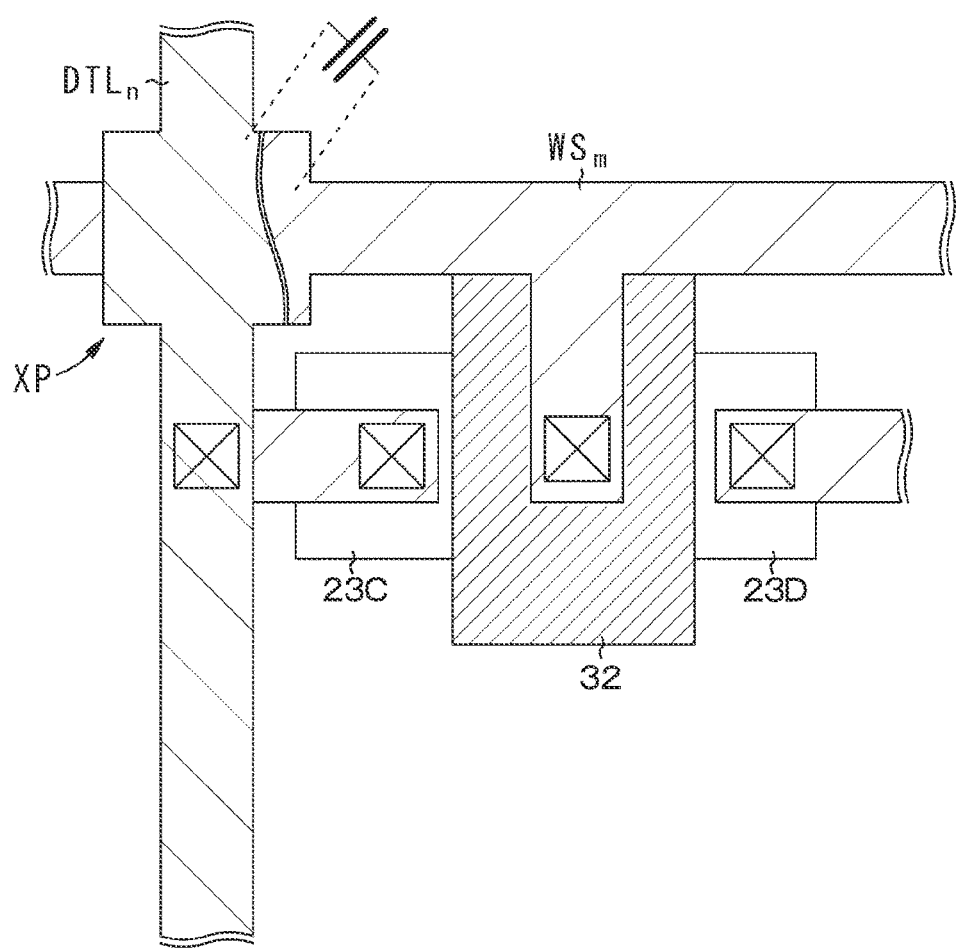
FIG. 19 is a schematic plan view continuing from FIG. 18 and explaining the typical layout of various lines and the like in a drive circuit.

FIG. 19 a schematic plan view continuing from FIG. 18 and explaining the typical layout of various lines and the like in a drive circuit. In this example, the line width of the scanning line WS and that of the data line DTL are increased where the scanning line WS and the data line DTL overlap with each other (indicated by reference sign XP). This layout increases the capacity of the overlapping portion, which increases the capacity between the data line DTL and the scanning line WS.

In the display apparatus according to the present disclosure described above, with the video signal voltage in a state of being held on the data line, the voltage of a scanning line different from the scanning line of the pixel targeted for writing is changed so as to vary the voltage of the data line via the capacity between the data line and the scanning line. Thereafter, the scanning line of the pixel targeted for writing is driven to write the voltage of the data line to the pixel. This makes it possible to write to the pixel a voltage exceeding the video signal voltage output from the source driver.

Electronic Equipment

The above-described display apparatus of the present disclosure may be used as a display section (display apparatus) of electronic equipment in all fields in which the video signal input to the electronic equipment or generated in the electronic equipment is displayed as an image or as video. For example, the display apparatus may be used as the display section of a television set, a digital still camera, a laptop personal computer, a mobile terminal apparatus such as a mobile phone, a video camera, or a head-mounted display (a display mounted on the head when used).

The display apparatus of the present disclosure also includes an encapsulated module type. An example of such a module type is a display module formed with a pixel array section bonded with a facing section such as transparent glass. Note that the display module may include a circuit section and a flexible printed circuit (FPC) for allowing the module to input and output signals to and from the outside. Described below are a digital still camera and head-mounted displays as specific examples of the electronic equipment that uses the display apparatus of the present disclosure. It is to be noted that the specific kinds of equipment are only examples and are not limitative of the electronic equipment that uses the display apparatus of the present disclosure.

Specific Example 1

Figure 20A:
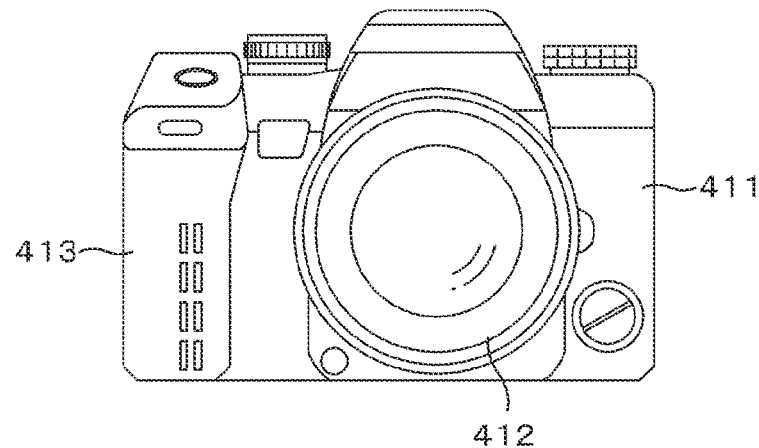
FIG. 20 depicts external views of a lens-interchangeable single-lens reflex digital still camera, FIGS. 20A and 20E being a front view and a rear view of the camera, respectively.
Figure 20B:
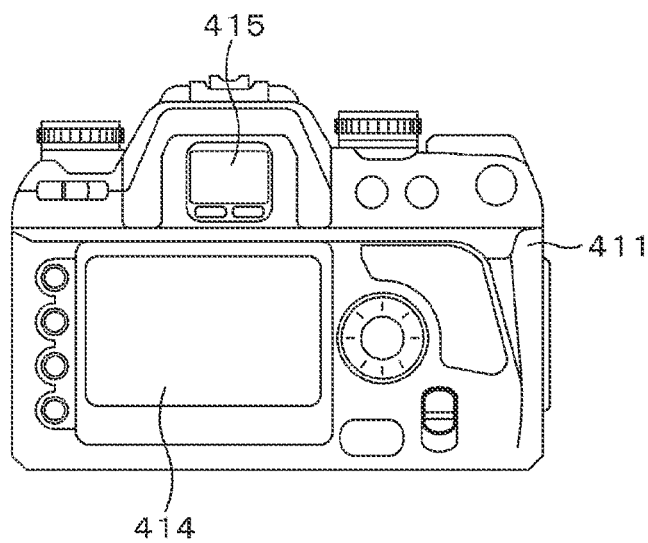

FIG. 20 depicts external views of a lens-interchangeable single-lens reflex digital still camera, FIGS. 20A and 20B being a front view and a rear view of the camera, respectively. For example, the lens-interchangeable single-lens reflex digital still camera has an interchangeable imaging lens unit (interchangeable lens) 412 on the front right side of a camera main body section (camera body) 411 and a grip section 413 on the front left side for the user to get a hold of the camera.

In addition, a monitor 414 is provided approximately at the rear center of the camera main body section 411. Provided above the monitor 414 is a viewfinder (eyepiece window) 415. By looking into the viewfinder 415, the photographer can visually recognize an optical image of a subject introduced through the imaging lens unit 412 and thereby determine a desired image composition.

On the above-described lens-interchangeable single-lens reflex digital still camera, the display apparatus of the present disclosure may be used as the viewfinder 415. That is, the lens-interchangeable single-lens reflex digital still camera of the present example is fabricated by use of the display apparatus of the present disclosure as the viewfinder 415.

Specific Example 2

Figure 21:
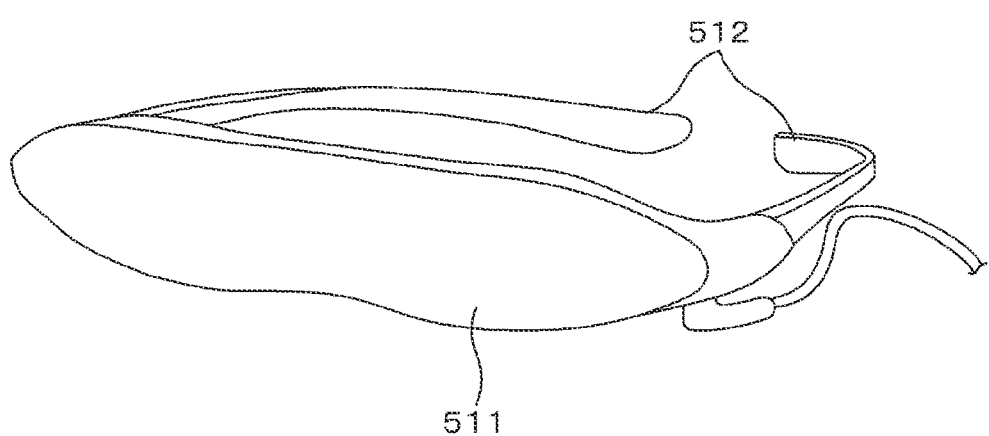
FIG. 21 is an external view of a head-mounted display.

FIG. 21 is an external view of a head-mounted display. For example, the head-mounted display has ear-hanging parts 512 on both sides of a spectacle type display section 511, the ear-hanging parts 512 being arranged to be mounted on the head of the user. On this head-mounted display, the display apparatus of the present disclosure may be used as the display section 511. That is, the head-mounted display of this example is fabricated by use of the display apparatus of the present disclosure as the display section 511.

Specific Example 3

Figure 22:
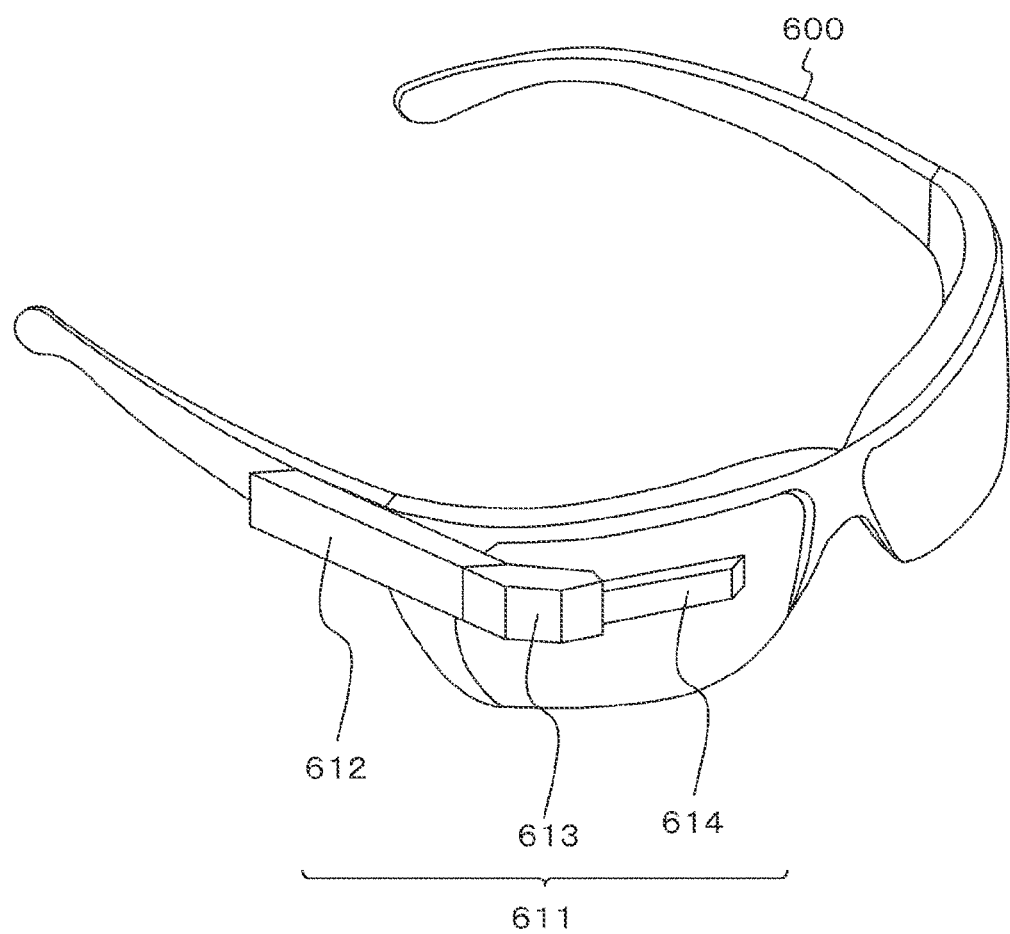
FIG. 22 is an external view of a see-through head-mounted display.
Figure 23:
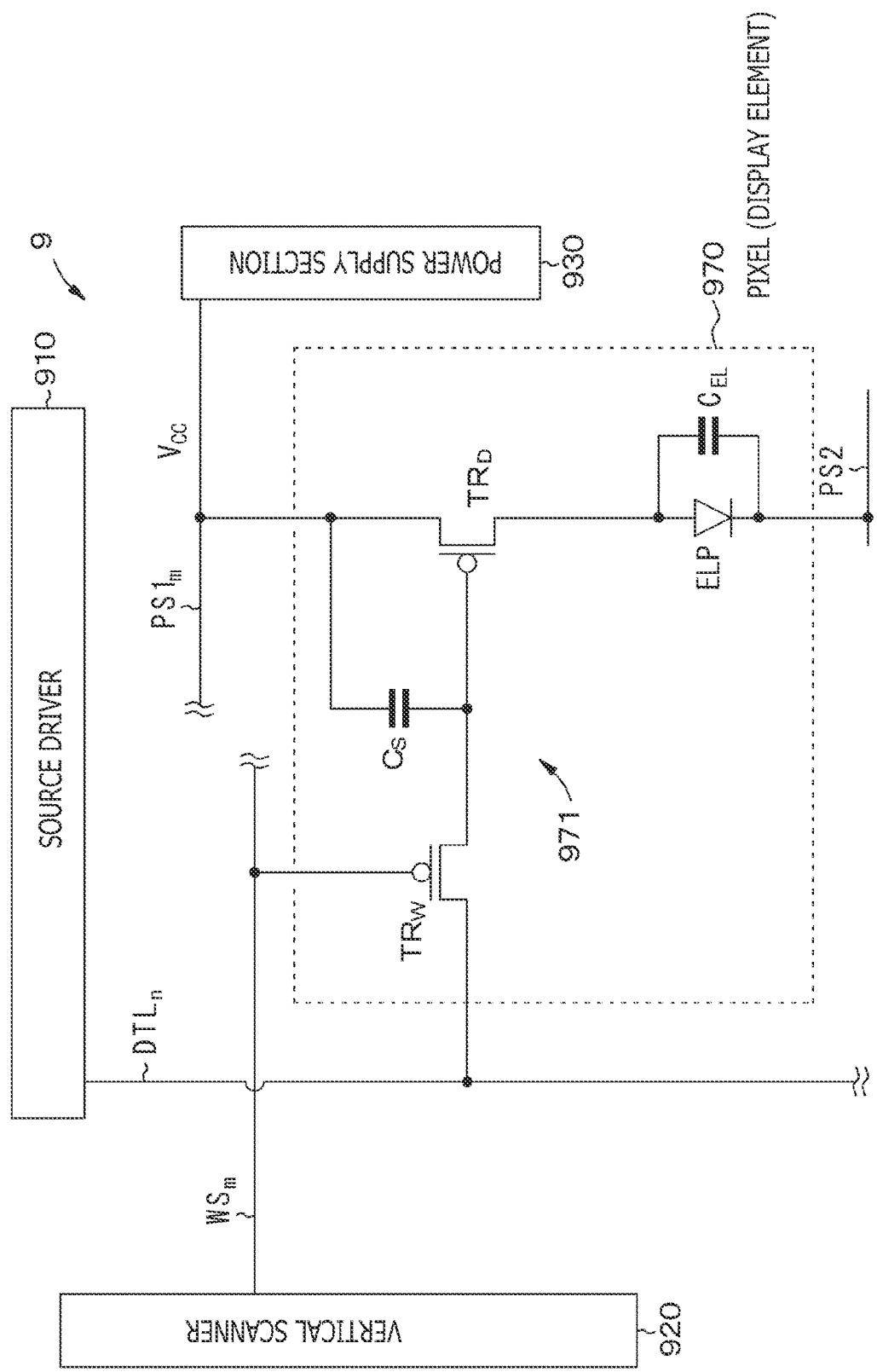
FIG. 23 is a view depicting a typical circuit configuration of a pixel positioned in an m-th row and an n-th column of a display apparatus that adopts as its pixels display elements each constituting, a drive circuit with use of p-channel type transistors.

FIG. 22 is an external view of a see-through head-mounted display. A see-through head-mounted display 611 includes a main body section 612, an arm 613, and a lens tube 614.

The main body section 612 is connected with the arm 613 and glasses 600. Specifically, the end in the long side direction of the main body section 612 is coupled with the arm 613, and one lateral side of the main body section 612 is connected with the glasses 600 via a connection member. Preferably, the main body section 612 may be mounted directly on the head of a person.

The main body section 612 incorporates a control board for controlling the operations of the see-through head-mounted display 611, as well as a display section. The arm 613 connects the main body section 612 with the lens tube 614 and thereby supports the lens tube 614. Specifically, the arm 613 connects the end of the main body section 612 with the end of the lens tube 614 to secure the lens tube 614. The arm 613 further incorporates a signal line for communicating data regarding images supplied from the main body section 612 to the lens tube 614.

The lens tube 614 projects image light which is provided from the main body section 612 via the arm 613, onto the eye of the user wearing the see-through head-mounted display 611 through an eyepiece lens. On the see-through head-mounted display 611, the display apparatus of the present disclosure may be used as the display section of the main body section 612.

Others

The present disclosure may also be implemented preferably in the following configurations.

[A1]
A display apparatus including:
a pixel array section that has pixels arranged in a row direction and a column direction in a two-dimensional matrix pattern, each of the pixels including a display element;
a scanning line provided for each of pixel rows arranged in the row direction; and
a data line provided for each of pixel columns arranged in the column direction,
in which, with the data line is a state of bolding a video signal voltage, a voltage of a scanning line different from the scanning line of the pixel targeted for writing is changed so as to vary a voltage of the data line via a capacity between the data line and the scanning line, the scanning line of the pixel targeted for writing being driven thereafter to write the voltage of the data line to the pixel.

[A2]
The display apparatus as stated in paragraph [A1] above, is which the voltage is changed on at least a portion of the scanning line for a pixel row different from the pixel row including the pixel targeted for writing, the different pixel row being placed is a non-light-emitting state for a predetermined time period.

[A3]
The display apparatus as stated in paragraph [A1] or [A1] above, in which the number of scanning lines of which the voltage is to be changed is determined variably, the scanning lines being different from the scanning line of the pixel targeted for writing.

[A4]
The display apparatus as stated in any one of paragraphs [A1] to [A3] above, in which a line width of the scanning line and that of the data line are expanded in a portion where the scanning line and the data line overlap with each other.

[A5]
The display apparatus as stated in any one of paragraphs [A1] to [A4] above,
in which the pixel includes a current-driven light-emitting, section and a drive circuit configured to drive the light-emitting section, and
the drive circuit includes at least
a capacity section,
a drive transistor configured to cause a current corresponding to a voltage held in the capacity section to flow through the light-emitting section, and
a write transistor configured to write a signal voltage to the capacity section.

[A6]
The display apparatus as stated in paragraph [A5] above,
in which the drive circuit is formed on a semiconductor substrate,
one source/drain region of the write transistor is connected with the data line, and a gate electrode of the write transistor is connected with the scanning line, and
a capacity between a gate of the write transistor and the one source/drain region of the write transistor functions as the capacity between the data line and the scanning line.

[A7]
The display apparatus as stated in paragraph [A6] above, in which another source/drain region of the write transistor is connected with a gate electrode of the drive transistor.

[A8]
The display apparatus as stated in paragraph [A6] or [A7] above, is which the write transistor is formed in such a manner that an amount of overlap between the one source/drain region and the gate electrode is larger than an amount of overlap between the other source/drain region and the gate electrode.

[A9]
The display apparatus as stated in any one of paragraphs [A6] to [A8] above, in which the one source/drain region of the write transistor is connected with a branch line extending from the data line in Parallel with the scanning line.

[A10]
The display apparatus as stated is any one of paragraphs [A5] to [A9] above,
in which the drive circuit further includes a light emission control transistor configured to place the light-emitting section in a non-light-emitting state, and
the light emission control transistor is controlled by a light emission control line provided for each of the pixel rows arranged in the row direction.

[A11]

The display apparatus as stated in paragraph [A10] above, in which a period is which the pixel row is placed in the non-light-emitting state by the light emission control transistor is controlled variably.

[A1]

The display apparatus as stated in any one of paragraphs [A5] to [A11] above, in which the drive transistor includes a p-channel type transistor.

[A13]

The display apparatus as stated in any one of paragraphs [A5] to [A11] above, in which the drive transistor includes an n-channel type transistor.

[A14]

The display apparatus as stated in any one of paragraphs [A5] to [A13] above, in which the light-emitting section includes an organic electroluminescence light-emitting section.

[B1]

A method of using and driving a display apparatus that includes
- a pixel array section that has pixels arranged in a row direction and a column direction in a two-dimensional matrix pattern, each of the pixels including a display element,
- a scanning line provided for each of pixel rows arranged in the row direction, and
- a data line provided for each of pixel columns arranged in the column direction, the method including the steps of:
causing the data line to hold a video signal voltage;
then changing a voltage of a scanning line different from the scanning line of the pixel targeted for writing so as to vary a voltage of the data line via a capacity between the data line and the scanning line; and
thereafter driving the scanning Line of the pixel targeted for writing, to write the voltage of the data line to the pixel.

[B2]

The method of driving the display apparatus as stated in paragraph [B1] above, in which the voltage is changed on at least a portion of the scanning line for a pixel row different from the pixel row including the pixel targeted for writing, the different pixel row being placed is a non-light-emitting state for a predetermined time period.

[B3]

The method of driving the display apparatus as stated in paragraph [B1] or [B2] above, in which the number of scanning lines of which the voltage is to be changed is determined variably, the scanning lines being different from the scanning line of the pixel targeted for writing.

[B4]

The method of driving the display apparatus as stated in any one of paragraphs [B1] to [B3] above, is which a line width of the scanning line and that of the data line are expanded in a portion where the scanning line and the data line overlap with each other.

[B5]

The method of driving the display apparatus as stated in any one of paragraphs [B1] to [B4] above,
  in which the pixel includes a current-driven light-emitting section and a drive circuit configured to drive the light-emitting section, and
  the drive circuit includes at least
    a capacity section,
    a drive transistor configured to cause a current corresponding to a voltage held in the capacity section to flow through the light-emitting section, and
    a write transistor configured to write a signal voltage to the capacity section.

[B6]

The method of driving the display apparatus as stated in paragraph [B5] above,
  in which the drive circuit is formed on a semiconductor substrate,
  one source/drain region of the write transistor is connected with the data line, and a gate electrode of the write transistor is connected with the scanning line, and
  a capacity between a gate of the write transistor and the one source/drain region of the write transistor functions as the capacity between the data line and the scanning line.

[B7]

The method of driving the display apparatus as stated in paragraph [B6] above, in which another source/drain region of the write transistor is connected with a gate electrode of the drive transistor.

[B8]

The method of driving the display apparatus as stated in paragraph [B6] or [B7] above, in which the write transistor is formed in such a manner that an amount of overlap between the one source/drain region and the gate electrode is larger than an amount of overlap between the other source/drain region and the gate electrode.

[B9]

The method of driving the display apparatus as stated in any one of paragraphs [B6] to [B8] above, in which the one source/drain region of the write transistor is connected with a branch line extending from the data line in parallel with the scanning line.

[B10]

The method of driving the display apparatus as stated in any one of paragraphs [B5] to [B9] above,
  in which the drive circuit further includes a light emission control transistor configured to place the light-emitting section in a non-light-emitting state, and
  the light emission control transistor is controlled by a light emission control line provided for each of the pixel rows arranged in the row direction.

[B11]

The method of driving the display apparatus as stated in paragraph [B10] above, in which a period in which the pixel row is placed in the non-light-emitting state by the light emission control transistor is controlled variably.

[B12]

The method of driving the display apparatus as stated in any one of paragraphs [B5] to [B11] above, in which the drive transistor includes a p-channel type transistor.

[B13]

The method of driving the display apparatus as stated in any one of paragraphs [B5] to [B13] above, in which the drive transistor includes an n-channel type transistor.

[B14]

The method of driving the display apparatus as stated in any one of paragraphs [B5] to [B13] above, in which the light-emitting section includes an organic electroluminescence light-emitting section.

[C1]
Electronic equipment including:
a display apparatus that includes
a pixel array section that has pixels arranged in a row direction and a column direction in a two-dimensional matrix pattern, each of the pixels including a display element,
a scanning line provided for each of pixel rows arranged in the row direction, and
a data line provided for each of pixel columns arranged in the column direction,
in which, with the data line in a state of holding a video signal voltage, a voltage of a scanning line different from the scanning line of the pixel targeted for writing is changed so as to vary a voltage of the data line via a capacity between the data line and the scanning line, the scanning line of the pixel targeted for writing being driven thereafter to write the voltage of the data line to the pixel.

[C2]
The electronic equipment as stated in paragraph [C1] above, in which the voltage is changed on at least a portion of the scanning line for a pixel row different from the pixel row including the pixel targeted for writing, the different pixel row being placed in a non-light-emitting state for a predetermined time period.

[C3]
The electronic equipment as stated in paragraph [C1] or [C2] above, in which the number of scanning lines of which the voltage is to be changed is determined variably, the scanning lines being different from the scanning line of the pixel targeted for writing.

[C4]
The electronic equipment as stated in any one of paragraphs [C1] to [C3] above, in which a line width of the scanning line and that of the data line are expanded in a portion where the scanning line and the data line overlap with each other.

[C5]
The electronic equipment as stated in any one of paragraphs [C1] to [C4] above,
in which the pixel includes a current-driven light-emitting section and a drive circuit configured to drive the light-emitting section, and
the drive circuit includes at least
a capacity section,
a drive transistor configured to cause a current corresponding to a voltage held in the capacity section to flow through the light-emitting section, and
a write transistor configured to write a signal voltage to the capacity section.

[C6]
The electronic equipment as stated in paragraph [C5] above,
in which the drive circuit is formed on a semiconductor substrate,
one source/drain region of the write transistor is connected with the data line, and a gate electrode of the write transistor is connected with the scanning line, and
a capacity between a gate of the write transistor and the one source/drain region of the write transistor functions as the capacity between the data line and the scanning line.

[C7]
The electronic equipment as stated in paragraph [C6] above, in which another source/drain region of the write transistor is connected with a gate electrode of the drive transistor.

[C8]
The electronic equipment as stated in paragraph [C6] or [C7] above, in which the write transistor is formed in such a manner that an amount of overlap between the one source/drain region and the gate electrode is larger than an amount of overlap between the other source/drain region and the gate electrode.

[C9]
The electronic equipment as stated in any one of paragraphs [C6] to [C8] above, in which the one source/drain region of the write transistor is connected with a branch line extending from the data line is parallel with the scanning line.

[C10]
The electronic equipment as stated in any one of paragraphs [C5] to [C9] above,
in which the drive circuit further includes a light emission control transistor configured to place the light-emitting section in a non-light-emitting state, and
the light emission control transistor is controlled by a light emission control line provided for each of the pixel rows arranged in the row direction.

[C11]
The electronic equipment as stated in paragraph [C10] above, in which a period in which the pixel row is placed is the non-light-emitting state by the light emission control transistor is controlled variably.

[C12]
The electronic equipment as stated in any one of paragraphs [C5] to [C11] above, in which the drive transistor includes a p-channel type transistor.

[C13]
The electronic equipment as stated in any one of paragraphs [C5] to [C11] above, in which the drive transistor includes an n-channel type transistor.

[C14]
The electronic equipment as stated in any one of paragraphs [C5] to [C13] above, in which the light-emitting section includes an organic electroluminescence light-emitting section.

REFERENCE SIGNS LIST 1, 9 . . . Display apparatus, 10 . . . Base material, 20 . . . Semiconductor layer, 21 . . . n-channel type well, 22 . . . Element isolation region, 23A, 23B, 23C, 23D . . . Source drain region, 31 . . . Gate insulating layer, 31' . . . Insulating layer, 32 . . . Gate electrode, 32' . . . Other electrode, 33 . . . Interlayer dielectric layer, 34 . . . One electrode, 35, 36 . . . Contact hole, 37 . . . Wiring, 38 . . . Shielded wiring, 40 . . . Interlayer dielectric layer, 51 . . . Anode electrode, 52 . . . Hole transport layer, light-emitting layer, and electron transport layer, 53 . . . Cathode electrode, 54 . . . Second interlayer dielectric layer, 55, 56 . . . Contact hole, 60 . . . Transparent substrate, 70, 970 . . . Display element, 71, 971 . . . Drive circuit, 80 . . . Pixel array section, 100 . . . Semiconductor substrate, 110, 910 . . . Source driver, 120, 920 . . . Vertical scanner, 130, 930 . . . Power supply section, 140 . . . Light emission control scanner, $TR_W$ . . . Write transistor, $TR_D$ . . . Drive transistor, $TR_S$ . . . Light emission control transistor, $C_S$ . . . Capacity section, ELP . . . Organic electroluminescence light-emitting section, $C_{EL}$ . . . Capacity of light-emitting section ELP, $C_{gs}$ . . . Capacity, WS . . . Scanning line, DTL . . . Data line, PS1 . . . Feeder line, PS2 . . . Common feeder line, DS . . . Light emission control line, 411 . . . Camera main body section, 412 . . . Imaging lens unit, 413 . . . Grip section, 414 . . . Monitor, 415 . . . Viewfinder, 511 . . . Spectacle type display section, 512 . . . Ear-hanging parts, 600 . . . Glasses, 611 . . . See-through head-mounted display, 612 . . . Main body section, 613 . . . Arm, 614 . . . Lens tube

The invention claimed is:

1. A display apparatus comprising:
   a pixel array section that has pixels arranged in a row direction and a column direction in a two-dimensional matrix pattern, each of the pixels including a display element;
   a scanning line provided for each of pixel rows arranged in the row direction; and
   a data line provided for each of pixel columns arranged is the column direction;
   wherein, with the data line in a state of holding a video signal voltage, a voltage of a scanning line different from the scanning line of the pixel targeted for writing is changed so as to vary a voltage of the data line via a capacity between the data line and the scanning line, the scanning line of the pixel targeted for writing being driven thereafter to write the voltage of the data line to the pixel.

2. The display apparatus according to claim 1, wherein the voltage is changed on at least a portion of the scanning line for a pixel row different from the pixel row including the pixel targeted for writing, the different pixel row being placed in a non-light-emitting state for a predetermined time period.

3. The display apparatus according to claim 1, wherein the number of scanning lines of which the voltage is to be changed is determined variably, the scanning lines being different from the scanning line of the pixel targeted for writing.

4. The display apparatus according to claim 1, wherein a line width of the scanning line and that of the data line are expanded in a portion where the scanning line and the data line overlap with each other.

5. The display apparatus according to claim 1,
   wherein the pixel includes a current-driven light-emitting, section and a drive circuit configured to drive the light-emitting section, and
   the drive circuit include at least
      a capacity section,
      a drive transistor configured to cause a current corresponding to a voltage held in the capacity section to flow through the light-emitting section, and
      a write transistor configured to write a signal voltage to the capacity section.

6. The display apparatus according to claim 5,
   wherein the drive circuit is formed on a semiconductor substrate,
   one source/drain region of the write transistor is connected with the data line, and a gate electrode of the write transistor is connected with the scanning line, and
   a capacity between a gate of the write transistor and the one source/drain region of the write transistor functions as the capacity between the data line and the scanning line.

7. The display apparatus according to claim 6, wherein another source/drain region of the write transistor is connected with a gate electrode of the drive transistor.

8. The display apparatus according to claim 6, wherein the write transistor is formed in such a manner that an amount of overlap between the one source/drain region and the gate electrode is larger than an amount of overlap between the other source/drain region and the gate electrode.

9. The display apparatus according to claim 6, wherein the one source/drain region of the write transistor is connected with a branch line extending from the data line in parallel with the scanning line.

10. The display apparatus according to claim 5,
    wherein the drive circuit further includes a light emission control transistor configured to place the light-emitting section in a non-light-emitting state, and
    the light emission control transistor is controlled by a light emission control line provided for each of the pixel rows arranged in the row direction.

11. The display apparatus according to claim 10, wherein a period in which the pixel row is placed in the non-light-emitting state by the light emission control transistor is controlled variably.

12. The display apparatus according to claim 5, wherein the drive transistor includes a p-channel type transistor.

13. The display apparatus according to claim 5, wherein the drive transistor includes an n-channel type transistor.

14. The display apparatus according to claim 5, wherein the light-emitting section includes an organic light-emitting section.

15. A method of using and driving a display apparatus that includes
    a pixel array section that has pixels arranged in a row direction and a column direction in a two-dimensional matrix pattern, each of the pixels including a display element,
    a scanning line provided for each of pixel rows arranged in the row direction, and
    a data line provided for each of pixel columns arranged is the column direction,
    the method comprising the steps of:
    causing the data line to hold a video signal voltage;
    then changing a voltage of a scanning line different from the scanning line of the pixel targeted for writing so as to vary a voltage of the data line via a capacity between the data line and the scanning line; and
    thereafter driving the scanning line of the pixel targeted for writing, to write the voltage of the data line to the pixel.

16. Electronic equipment comprising:
    a display apparatus that includes
       a pixel array section that has pixels arranged is a row direction and a column direction in a two-dimensional matrix pattern, each of the pixels including a display element,
       a scanning line provided for each of pixel rows arranged in the row direction, and
       a data line provided for each of pixel columns arranged in the column direction,
    wherein, with the data line in a state of holding a video signal voltage, a voltage of a scanning line different from the scanning line of the pixel targeted for writing is changed so as to vary a voltage of the data line via a capacity between the data line and the scanning line, the scanning line of the pixel targeted for writing being driven thereafter to write the voltage of the data line to the pixel.

* * * * *